United States Patent
Zoorob et al.

(10) Patent No.: US 7,509,012 B2
(45) Date of Patent: Mar. 24, 2009

(54) LIGHT EMITTING DIODE STRUCTURES

(75) Inventors: Majd Zoorob, Southhampton (GB); John Lincoln, Wiltshire (GB)

(73) Assignee: Luxtaltek Corporation, Kuan-Yuan Science Park, Chunan Miaoli County (TW)

( * ) Notice: Subject to any disclaimer, the term of this patent is extended or adjusted under 35 U.S.C. 154(b) by 0 days.

(21) Appl. No.: 10/946,747

(22) Filed: Sep. 22, 2004

(65) Prior Publication Data

US 2006/0062540 A1    Mar. 23, 2006

(51) Int. Cl.
    *G02B 6/10*    (2006.01)
(52) U.S. Cl. ..................................... 385/129
(58) Field of Classification Search ............... None
    See application file for complete search history.

(56) References Cited

U.S. PATENT DOCUMENTS

| | | | |
|---|---|---|---|
| 4,955,692 A * | 9/1990 | Merlin et al. | 378/145 |
| 5,955,749 A | 9/1999 | Joannopoulos et al. | |
| 6,775,448 B2 * | 8/2004 | Zoorob | 385/122 |
| 6,888,994 B2 * | 5/2005 | Baumberg et al. | 385/129 |
| 2002/0074537 A1 | 6/2002 | John et al. | |
| 2004/0086249 A1 | 5/2004 | Zoorob | |
| 2004/0091224 A1 * | 5/2004 | Baumberg et al. | 385/129 |
| 2004/0206962 A1 | 10/2004 | Erchak et al. | |
| 2004/0206972 A1 | 10/2004 | Erchak et al. | |
| 2004/0207310 A1 | 10/2004 | Erchak et al. | |
| 2004/0207319 A1 | 10/2004 | Erchak et al. | |
| 2004/0259285 A1 | 12/2004 | Erchak et al. | |
| 2005/0008060 A1 | 1/2005 | Lipson et al. | |
| 2006/0280403 A1 * | 12/2006 | Suh et al. | 385/27 |

FOREIGN PATENT DOCUMENTS

| | | | |
|---|---|---|---|
| GB | WO 01/77726 | * 10/2001 | |
| GB | WO0177726 | * 10/2001 | 385/129 |
| WO | WO 98/53351 A2 | 11/1998 | |

OTHER PUBLICATIONS

M.E. Zoorob, et al., "Complete photonic bandgaps in 12-fold symmetric quasicrystals," *Nature*, vol. 404, No. 6779, pp. 740-743 (2000).

European Patent Office, Standard Search Report for USA 94674704, completed Apr. 29, 2005.

Erchak et al., "Enhanced coupling to vertical radiation using a two-dimensional photonic crystal in a semiconductor light-emitting diode", *Applied Physics Letters*, vol. 78, No. 5, Jan. 29, 2001, pp. 563-565.

* cited by examiner

*Primary Examiner*—Sung H Pak
*Assistant Examiner*—Hoang Tran
(74) *Attorney, Agent, or Firm*—McDonnell Boehnen Hulbert & Berghoff LLP

(57) ABSTRACT

According to one aspect of the present invention, a light emitting diode (LED) structure including an active core layer and at least one substrate layer having a first refractive index, comprises a 2-dimensional photonic quasicrystal in the structure, the photonic quasicrystal comprising an array of regions having a second refractive index, the array exhibiting long range order but short range disorder. The long range order is associated with diffractive properties of the structure and gives rise to uniform-far field diffraction patterns from the LED. The present invention enjoys the benefit of improved light extraction from LEDs without undesirable far field illumination patterns.

27 Claims, 19 Drawing Sheets

LIGHT EMITTING DIODE STRUCTURES

FIELD OF THE INVENTION

The present invention relates to light emitting diodes (LEDs) and in particular to LEDs with improved efficiency.

BACKGROUND TO THE INVENTION

LEDs have many potential applications. For example, LEDs can be used in displays, such as LCDs and in projection, entertainment, general lighting and automotive applications where high brightness and compact illumination is required. The benefits of LEDs over conventional incandescent lighting and halogen lighting are high brightness, long life, instant operation, energy saving, environmental friendliness, durability and compactness.

Notwithstanding those benefits, most of the light generated inside a conventional LED cannot be efficiently extracted from the active layer. Almost 80% of the light generated in an LED is outside the escape cone of the structure. Most of the light remains either guided in the core or totally internally reflected in the high refractive index substrate layer.

The potential for increasing the efficiency, and in particular the light extraction efficiency, of LEDs has long been recognised. For example, the difference between the refractive index of a high index substrate (n~3.5) and that of the epoxy used to encapsulate the LED (n~1.5) is large, resulting in a relatively small critical angle for total internal reflection. This in turn dramatically restricts the external quantum efficiency compared to that of the internal quantum efficiency. It has been realised that using an optically transparent conductive layer and a cladding with a low refractive index and transmitting substrates with a low refractive index improves light extraction efficiencies.

FIG. 1 illustrates a method that has been used to improve directionality of light emitted from the LED structure. FIG. 1a shows the 6 light escape cones from the active layer of an LED. FIG. 1b shows the use of a Distributed Bragg Reflector 104 located underneath the active layer, which reflects light back up and out of the LED. The use of a Distributed Bragg Reflector is used to direct more light out of the top of the LED structure emitting power in a specific angular cone. This technique is described in U.S. Pat. No. 6,015,719.

Alternatively, or additionally, the use of microlens arrays placed on the top surface of an LED structure can provide enhanced extraction. This was first proposed in U.S. Pat. No. 5,087,949. It has also been suggested by S Moller et al. in Journal of Applied Physics 91, 3324 that attaching the microlens array on an organic LED (OLED) glass substrate can provide similar benefits to those found with semiconductors LEDs, where an external coupling efficiency improvement of x2.3 across the complete viewing half space was observed.

An illustration of the use of microlens arrays on the surface of an LED structure is shown in FIG. 2. Numeral 201 shows the out of plane coupling of light. A microlens array 202 is placed on the top of a glass substrate 203 which covers the active layer of a conventional LED.

FIG. 3 shows the use of angled facets to preferentially reflect light combined in the active layer out of the top surface of the structure. The active layer 302 and the overlying cladding layer have tapered side walls 305. A metal contact 303 is shown on the top surface. The light generated in the active layer reflects off the walls 305 and exits the top of the structure. This is described in U.S. Pat. No. 6,015,719.

The use of high index polymers that are optically clear can significantly reduce reflection losses at the semiconductor substrate/air interface. This is illustrated in FIG. 4. FIG. 4a shows a conventional low index gel 401 on an LED. The escape cone angle from the active layer 404 is shown as 402. The fundamental waveguide mode angle 403 lies outside the escape cone. FIG. 4b shows the use of a high index gel. The use of a high index gel 406 provides a reduced refractive index contrast and hence provides a larger escape cone angle 407 for the totally internally reflected light. The fundamental waveguide mode angle 405 now lies within the escape cone. A light output increase of around 20% can be achieved by the variation of refractive index from 1.46 to 1.60.

Another approach taken to improve the extraction efficiency of LEDs is taught by Schnitzer et al in Applied Physics Letters 63, 2174 (1993). This paper describes the use of random texturing or roughening of the surface of the semiconductor LED as shown in FIG. 5. Referring to FIG. 5, the roughening 503 on the surface of the LED provides multiple miniature domains with different escape angles. When the totally internally reflected light from the active layer 502 is incident on one of those surfaces it has an increased probability of lying in the escape angle of that surface as compared to a totally flat surface. This provides an improved extraction efficiency. While this method is efficient at extracting light that is experiencing multiple total internal reflections due to absorptive regions within an LED, the light is rapidly attenuated and hence does not contribute to orders of magnitude light extraction and improvement.

In U.S. Pat. No. 5,779,924 the use of periodic texturing on at least one interface of the structure is described and is suggested to improve the extraction of light out of the active core layer 603. This is shown in FIG. 6. The periodic texturing 602 directs more light out of the structure without totally internally reflecting the light inside the structure, where it is greatly attenuated.

Instead of periodic texturing, photonic crystals have been used to achieve the same effect of enhanced light extraction. This is described in U.S. Pat. No. 5,955,749.

Surface roughening, periodic texturing and regular photonic crystals all enhance light extraction from LEDs through the same mechanism, that of modifying the surface profile to improve the probability that light generated in the active layer incident on the surface will be incident at an angle to the surface which allows it to escape from the structure.

Regular photonic crystals (PCs) can also lead to greater light extraction via another mechanism. It is well known that it is generally not desirable to etch into the active layer due to increased surface recombination of carriers, which affects the overall photoluminescence quantum efficiency of the active layer. Nevertheless, if the PC is in close proximity to the active layer it is possible to enhance the rate of spontaneous emission through the Purcell effect. In the Purcell effect it is suggested that the spontaneous emission of an atom placed within a wavelength-sized microcavity can be increased when compared to a bulk structure. A regular photonic crystal 704, as shown in FIG. 7, can confine an optical mode in a "cavity" 707 by virtue of the effective refractive index contrast experienced by the optical mode in the active layer 705. The emitted light is shown as 703.

Erchak et al, in App. Phys. Lett. Vol. 78, no. 5, 29 Jan. 2001, Pg. 563-565 have reported a 6-fold increase in light due to increased extraction and radiation efficiency by the use of a PC embedded in an LED.

Alternative proposed designs suggest grating type PC structures. In this set-up it is suggested that the direct transmitted mode drains only 20% of the total photons while 50% of the light is confined in high index guided modes. The high-index guided modes are very efficiently coupled into external modes and launched out of the structure.

However, due to the highly diffractive nature of regular photonic crystals, the far field emission out of the top of LED structures is localised into Bragg spots (which follows the periodic lattice nature of the PC structure), as shown in FIG. 8. FIG. 8 shows in cross-section a regular photonic crystal 802 in an LED structure with an active layer 804, as shown in FIG. 7. The structure is also shown from above. The out of plane coupled light 801 forms a far filed illumination pattern 805 consisting of a number of Bragg spots. For most applications it is desirable to achieve more even illumination in the far field.

It is an object of the present invention to provide improved light extraction from LEDs whilst obtaining desirable far-field illumination.

SUMMARY OF THE INVENTION

According to a first aspect of the present invention, a light emitting diode (LED) structure including an active core layer and at least one substrate layer having a first refractive index, comprises a 2-dimensional photonic quasicrystal (PQC) in the structure, the photonic quasicrystal comprising an array of regions having a second refractive index, the array exhibiting long range order but short range disorder. The long range order is associated with diffractive properties of the structure.

Quasicrystals are aperiodic structures which possess a type of long range translational order called quasiperiodicity. A detailed discussion of quasicrystals is found in "Quasicrystals: A matter of definition" by Ron Lifshitz, Foundations of Physics, vol. 33, no. 12, December 2003 and includes a mathematical definition of quasiperiodic. In this specification, quasicrystal should be taken to include all quasiperiodic structures, excluding regular periodic structures.

Preferably, the Fourier transform of the array has a degree of rotational symmetry n, where n>6. The high degree of symmetry of photonic quasicrystals of this type results in photonic bandgaps with a high degree of isotropy. Complete bandgaps can be achieved even with a low refractive index contrast.

The bandgap may be designed (by varying the spacing between the nearest neighbour regions, as well as the diameter, depth and index of the regions) so that a stopband overlaps with the emission spectrum of the active layer in the LED. Bandgap design for regular photonic crystals in this way is well known. Preferably, the bandgap is in all directions and for all polarisations.

LEDs incorporating photonic quasicrystals in accordance with the present invention have an improved extraction efficiency over conventional LEDs and over LEDs incorporating regular photonic crystals. Quasicrystal structures offer a number of benefits. For example, more isotropic bandgaps found in Photonic quasicrystals leads to greater mode confinement and hence greater extraction efficiency. It is noted that ordinary photonic crystals suffer from anisotropic bandgaps which do not overlap for different propagation directions (except for high refractive index contrasts) and hence do not confine a single wavelength of light with the same penetration depth in all directions. Furthermore, the long range order which is a property of quasicrystals leads to more uniform far field diffraction patterns. Close packing of regions made possible in quasicrystal structures leads to a greater surface area through which photons can exit the structure and hence greater extraction efficiency.

Preferably, the substrate layer is a dielectric layer and the quasicrystal is a variation in refractive index extending partially or completely across the layer. Alternatively, an additional layer of different refractive index, or formed from a metal, can be positioned in the substrate layer or between the core layer and the substrate layer, the additional layer comprising an array of regions arranged in a quasicrystal geometry.

The quasicrystal may be in the form of a Fibonacci spiral pattern. Alternatively, the array may be in a Penrose tiling pattern. It may also be in a non-uniform Euclidean tiling pattern.

An LED in accordance with the present invention may include photonic quasicrystals in more than one layer. For, example, the active layer may be sandwiched between a pair of photonic quasicrystal layers. The LED may include a plurality of different photonic quasicrystals or a combination of photonic quasicrystals and ordinary photonic crystals.

The substrate layer may include a section of photoinc quasicrystal that is repeated periodically.

The regions of quasicrystal may be of any shape and size, and may vary in their geometric or material properties across the array. The quasicrystal may include regions of tunable material to provide for a tunable optical output.

According to a second aspect of the present invention, a light emitting diode (LED) structure including an active core layer and a least one substrate layer having a first refractive index, comprises a 2-dimensional photonic band structure in the substrate layer, the photonic band structure comprising an array of regions having a second refractive index, wherein each region has a predetermined constant spacing from at least one other region and each region is spaced from all other regions by a predetermined minimum distance but wherein the array of regions is amorphous.

According to a third aspect of the present invention, a method of extracting light from an LED structure comprises the step of providing a 2-dimensional photonic quasicrystal in the LED structure, the photonic quasicrystal exhibiting long range order but short range disorder.

According to a fourth aspect of the present invention, a method of manufacturing an LED structure comprises the steps of:

providing an active core layer;

providing at least one substrate layer; and forming a photonic quasicrystal in the substrate layer, the photonic quasicrystal exhibiting long range order but short range disorder.

According to a fifth aspect of the present invention, a method of manufacturing an LED structure comprises the steps of:

providing an active core layer;

providing at least one substrate layer having a first refractive index; and forming a photonic band structure in the substrate layer, the photonic band structure comprising an array of regions having a second refractive index, wherein each region has a predetermined constant spacing from at least one other region and each region is spaced from all other regions by a predetermined minimum distance but wherein the array of regions is amorphous.

LEDs in accordance with the first or second aspect of the invention may be incorporated into a great many optical systems such as a vehicle headlamp or a dashboard display, a projection system or traffic lights, to name a few examples.

BRIEF DESCRIPTION OF THE DRAWINGS

Examples of the present invention will now be described in detail with reference to the accompanying drawings, in which.

DETAILED DESCRIPTION

Figure 1A:
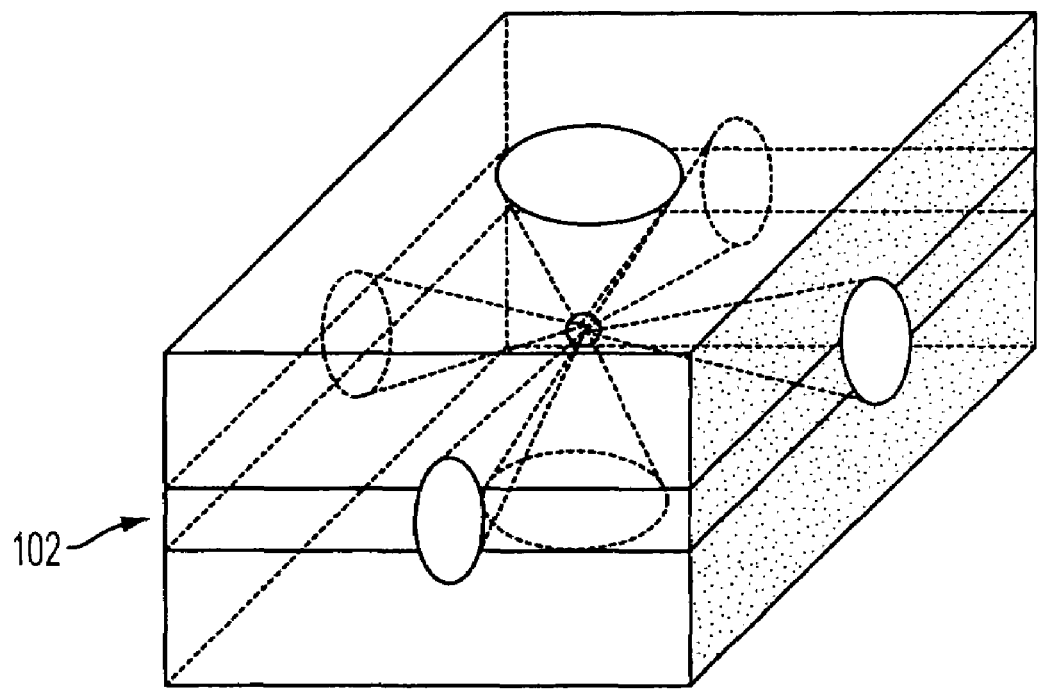
FIG. 1 is a schematic illustration of an LED including a distributed Bragg reflector.
Figure 1B:
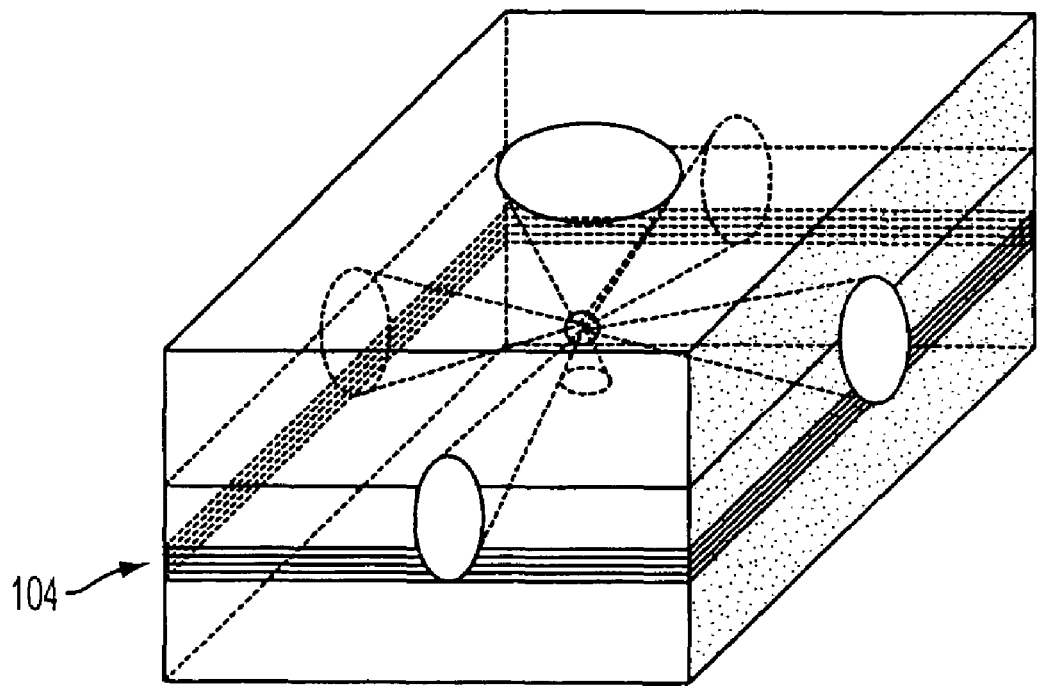
Figure 2:
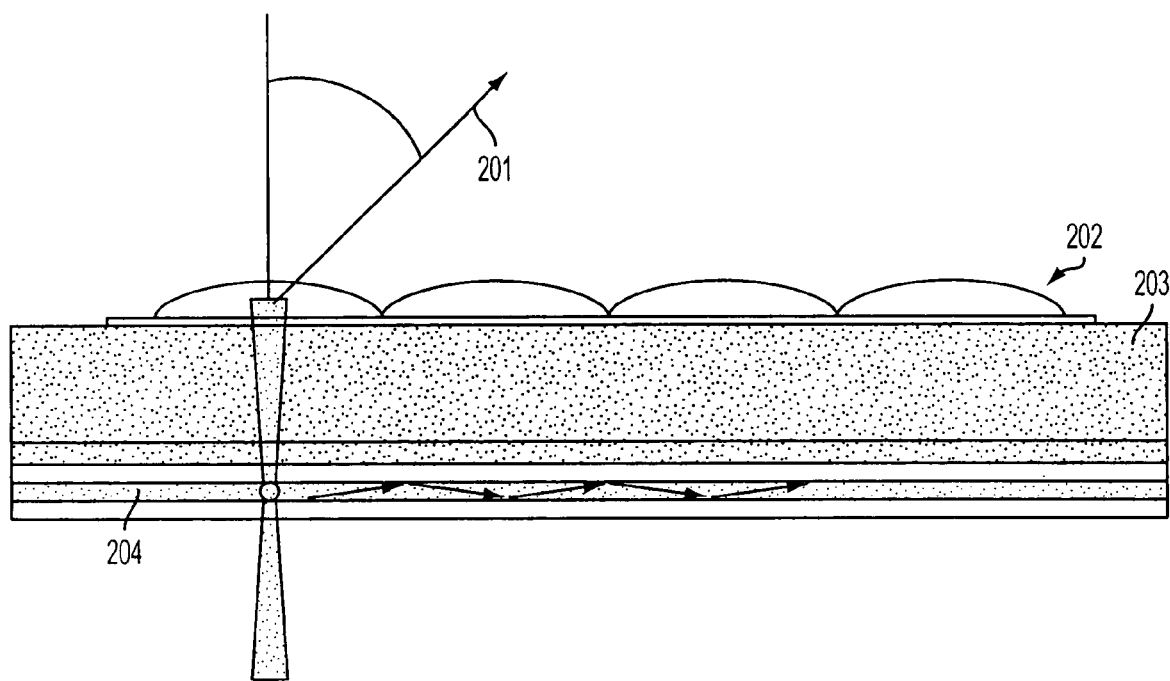
FIG. 2 is a schematic illustration of an LED with a microlens array on one surface.
Figure 3:
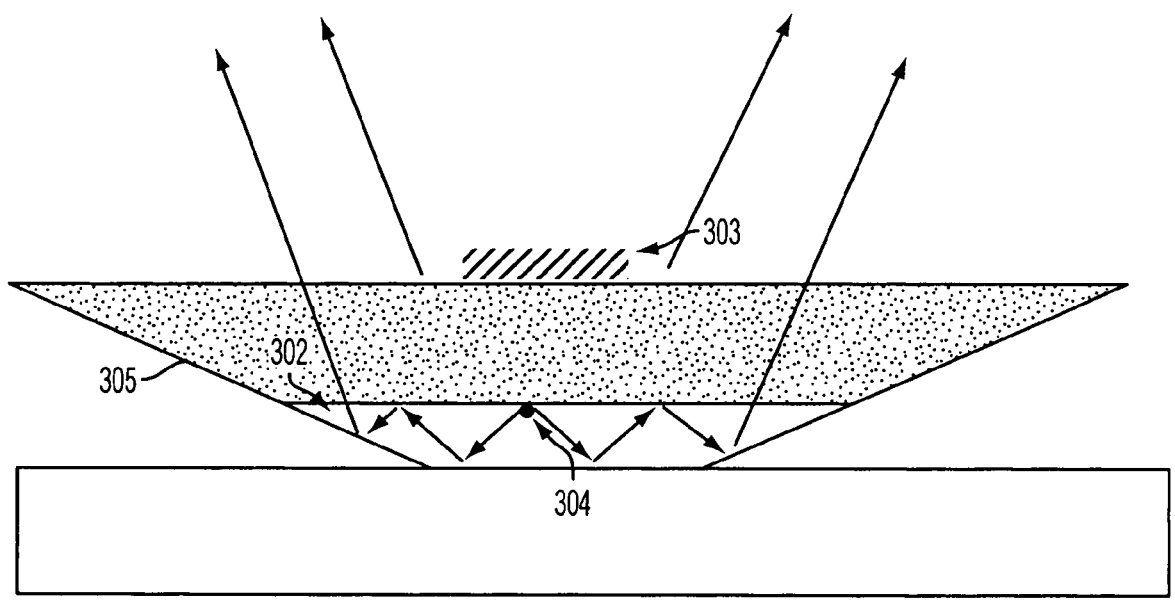
FIG. 3 is a schematic illustration of an LED with tapered sidewalls.
Figure 4A:
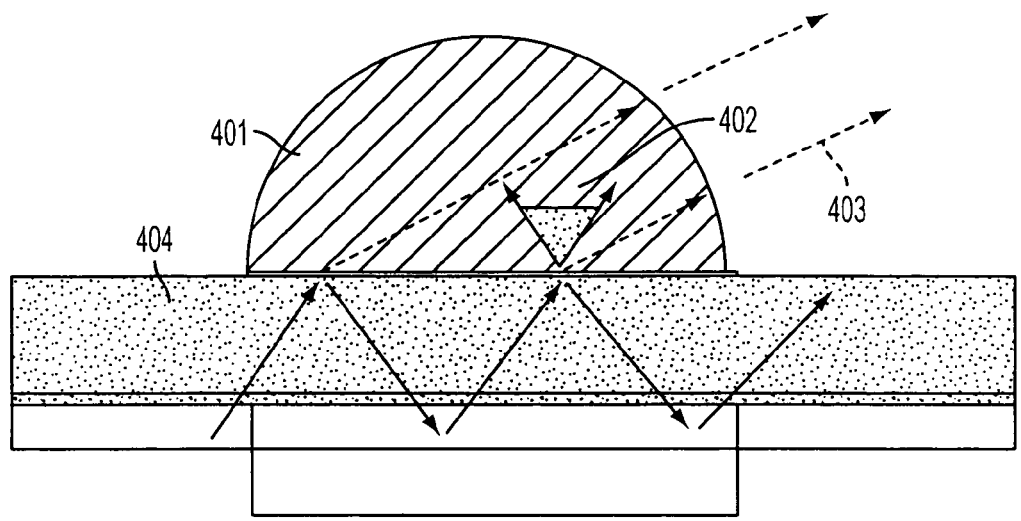
FIG. 4 illustrates the use of different refractive index gels on the surface of an LED.
Figure 4B:
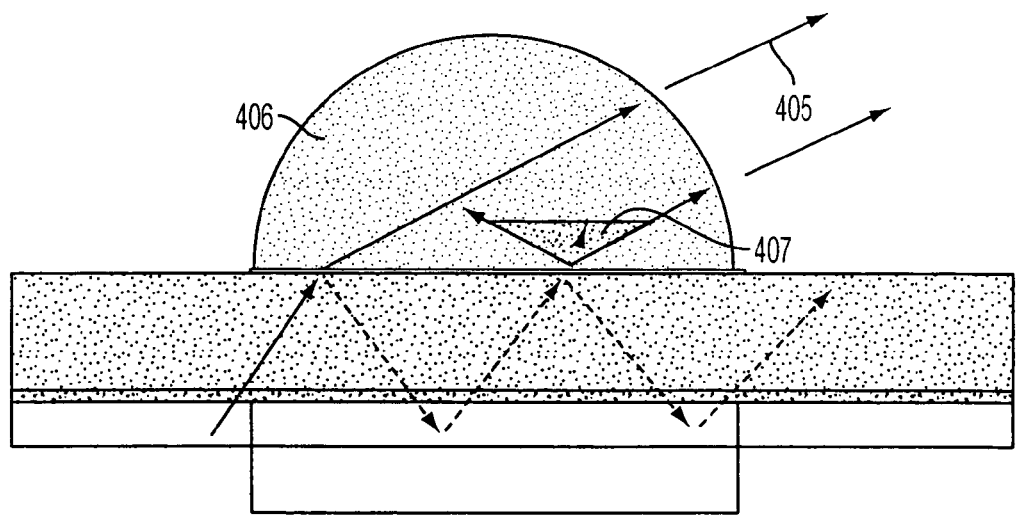
Figure 5:
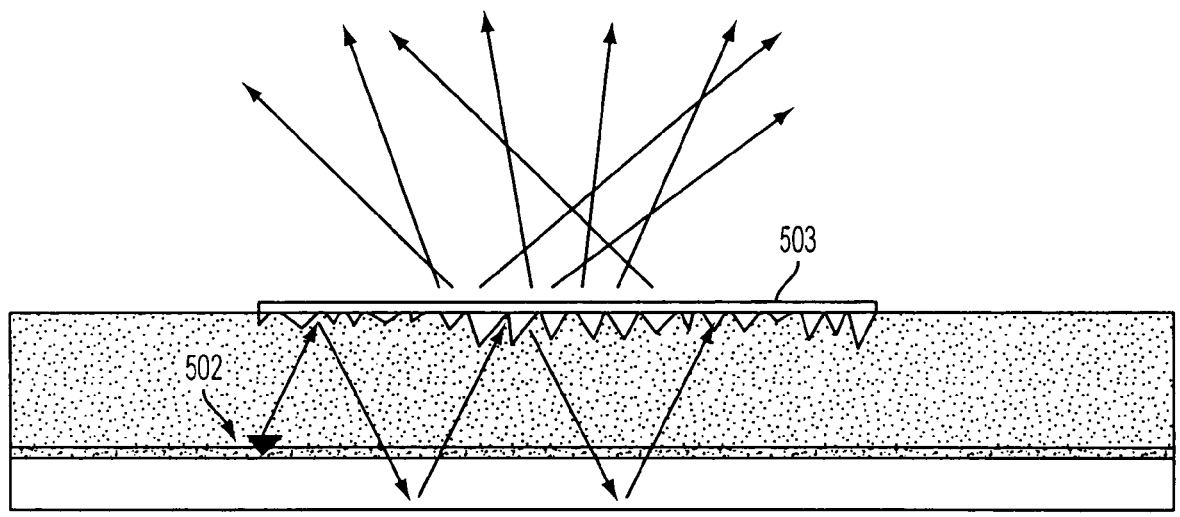
FIG. 5 is a schematic illustration of an LED with a roughened surface.
Figure 6:
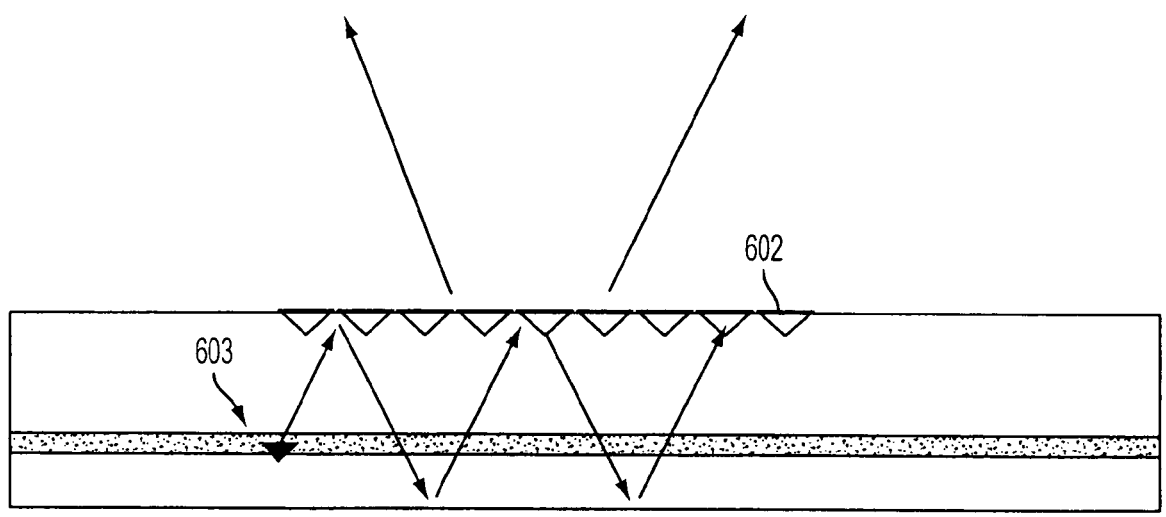
FIG. 6 is a schematic illustration of an LED with a grating structure on one surface.
Figure 7:
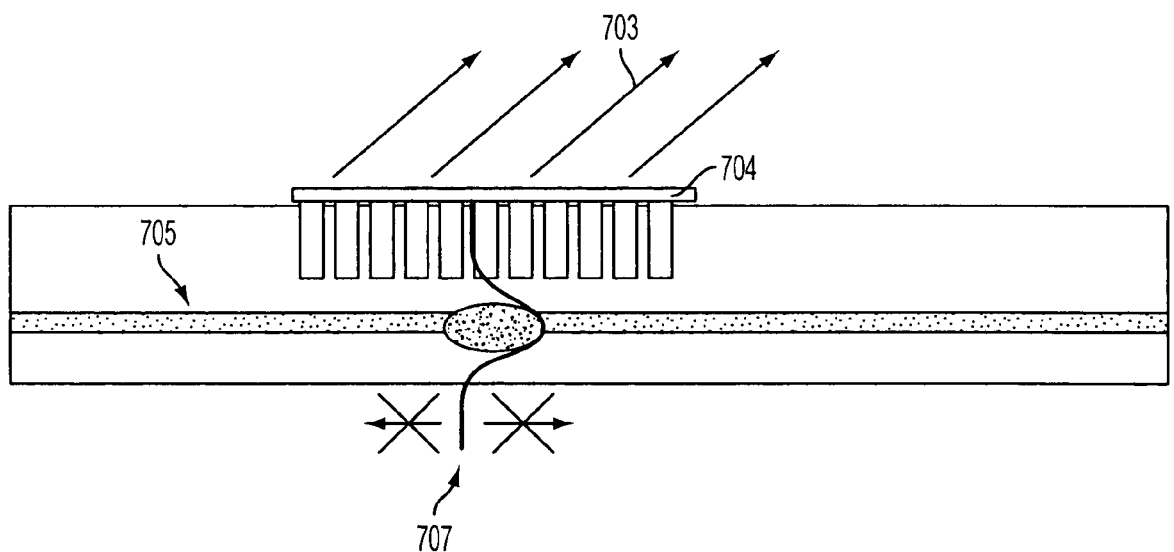
FIG. 7 is a schematic illustration of an LED with a photonic crystal structure in one layer of the LED.

There are three possible uniform tilings of the plane by regular polygons, using squares, triangles or hexagons. In 1-uniform tilings there is only one type of vertex in the plane. Additionally there are 13 different orientations for filling the space using 1-uniform (Archimedian) tilings. These tiling patterns form the basis of what, in this specification, will be referred to as regular 2D photonic crystals. Regular 2D photonic crystals are typically formed in dielectric material and have an array of regions forming a periodic variation in refractive index, the periodicity based on one of the uniform tilings of the plane. The simplest example of a photonic crystal of this type is an array of holes in a dielectric slab, an etched air rod being positioned at each vertex of a uniform tiling pattern.

Photonic crystals offer unique ways to tailor light and the propagation of electromagnetic (EM) waves. By analogy to electrons in a crystal, EM waves propagating in a structure with a periodically-modulated dielectric constant set up Bloch modes that form photonic band structures. Due to the dielectric contrast and periodicity, photonic bandgaps are set up where EM propagation is forbidden.

2-dimensional photonic crystals have been suggested for use in LEDs to improve light extraction. There are two mechanisms by which photonic crystals can improve light extraction from LEDs:

(1) Surface patterning can increase the likelihood of light escaping the structure before being totally internally reflected and attenuated in the substrate of the LED;

(2) Enhancement of spontaneous emission in the active layer by the Purcell effect.

However, regular 2-dimensional photonic crystals in LEDs give rise to often undesirable far field diffraction patterns. Furthermore, the Purcell effect has a limited effect using regular 2-dimensional photonic crystals in LED structures as light confinement is not isotropic.

In one embodiment of the present invention, a 2-dimensional quasicrystal is used in a layer of a LED structure other than the active layer. A photonic quasicrystal (PQC) is a photonic band structure that exhibits short range translational disorder but long range, quasiperiodic order. Examples are described by Zoorob et al. In Nature 2000, vol. 404, 13 Apr. 2000 and possess complete bandgaps even in low index materials. Photonic quasicrystals have very isotropic bandgaps. Quasicrystals provide benefits both in terms of the output light pattern generated by the LED in which they are embedded and in terms of the Purcell effect.

Photonic quasicrystals are formed in the same way as regular photonic crystals. A 2-dimensional quasicrystal can be composed of an array of rods of dielectric material or an array of holes in a dielectric material. Generally, a 2-dimensional quasicrystal can be described as an array of rods of a second refractive index in a background material of a first refractive index. In the present invention, the photonic quasicrystal is designed by selecting the spacing between the nearest neighbour rods as well as the diameter, depth and index of the rods, so that it overlaps with the emission spectrum of the active layer in the LED. This provides wavelength selectivity as well as enhanced modal confinement. Ideally, the bandgap is in all directions and for all polarisations.

The Purcell effect will now be briefly described. The spontaneous emission enhancement factor described by the Purcell effect is given by the following equation:

$$P = \frac{3}{4\pi^2}\left(\frac{\lambda}{n}\right)^3 \frac{Q}{V}$$

where $\lambda$=wavelength, n=refractive index V=volume of cavity, Q=confinement factor (which is proportional to the time a photon is confined in the cavity).

From this equation it is clear that the smaller the volume the larger the enhancement factor. By placing an appropriately designed photonic quasicrystal structure with strong light confinement (ideally with a bandgap overlapping the emission spectrum of the active layer) close to the active layer small confinement volumes can be produced throughout the quasicrystal structure without the need for defects. If the light is emitted in the vicinity of the photonic bandgap the high Q factor gives rise to strong localisation effects in the active layer, leading to dramatic increases in spontaneous emission. The fact that photonic quasicrystals have such isotropic bandgaps further enhances the confinement and hence the spontaneous emission. It should be noted in this regard that regular 2-dimensional photonic crystals have anisotropic bandgaps which do not overlap for all propagation directions and hence would not confine the light sufficiently in all directions.

In an LED structure a photonic quasicrystal can be provided in one of the layers in a number of ways. The quasicrystal can be defined by a variation in the height of one of the layers or interfaces in the LED. Alternatively, a variation in the refractive index of a specific region can define the vertex of one element in the quasicrystal. The refractive index of the structure can be varied by doping the desired region by diffusion or by ion implantation, while the height of a particular layer can be defined by etching a specific region. (Ion implantation is a well known technique and is described in Dearnaley, G., Freeman, J. H., Nelson, R. S., Stephen, J. Ion Implantation; American Elsevier Publishing Co., New York, 1973; 802 pp.).

FIG. 9 illustrates four different examples in accordance with the present invention. FIG. 9a shows schematically an LED structure in which a photonic quasicrystal 901 has been etched into the surface. FIG. 9b shows a photonic quasicrystal 902 embedded in one layer 903 of an LED structure. A structure of this type can be formed by etching in to the desired layer and subsequently overgrowing the overlying layers. FIG. 9c shows a photonic quasicrystal 904 formed by diffusing a dopant into predetermined locations to locally vary the refractive index in the structure. This can be achieved by lithographically defining a mask, which is later etched and used as a template for ion implantation or diffusion. An electrical contact 905 and active layer 906 are shown, as in FIGS. 9a and 9b.

Figure 9A:
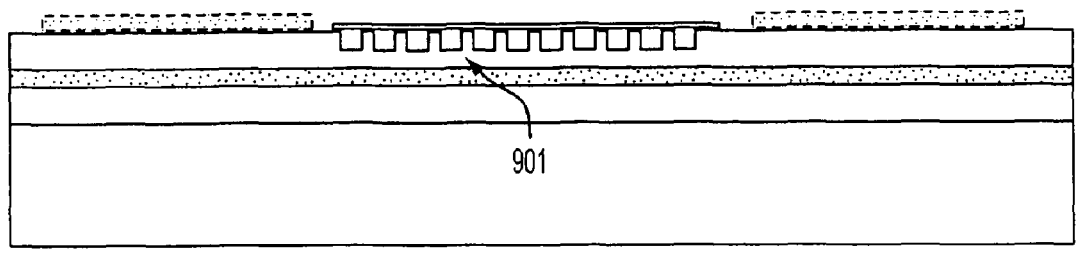
FIG. 9 shows cross sections of three different positions for photonic quasicrystals in an LED in accordance with the present invention.
Figure 9B:
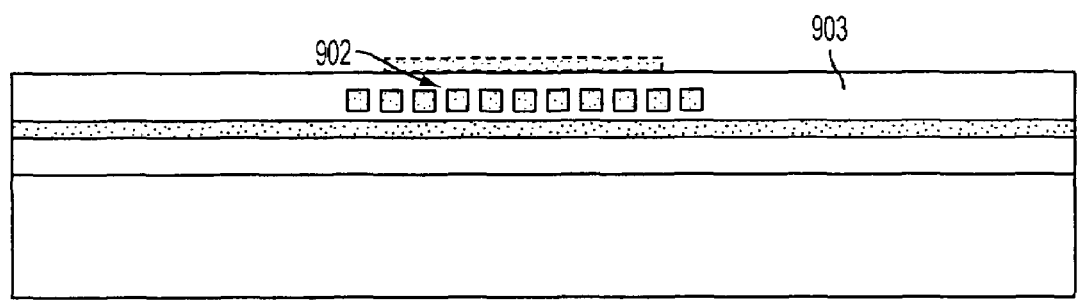
Figure 9C:
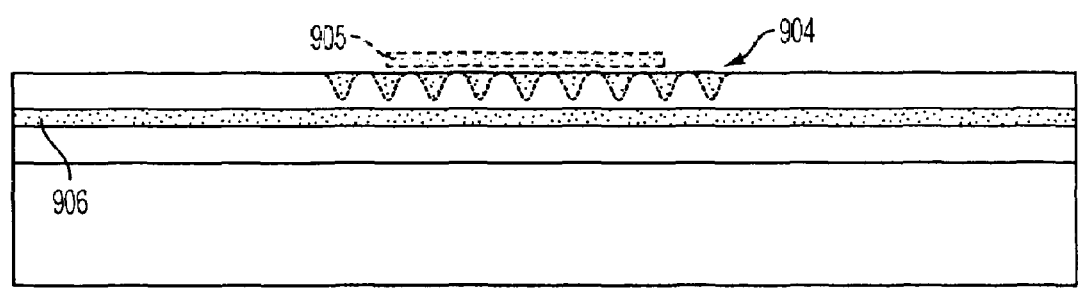
Figure 9D:
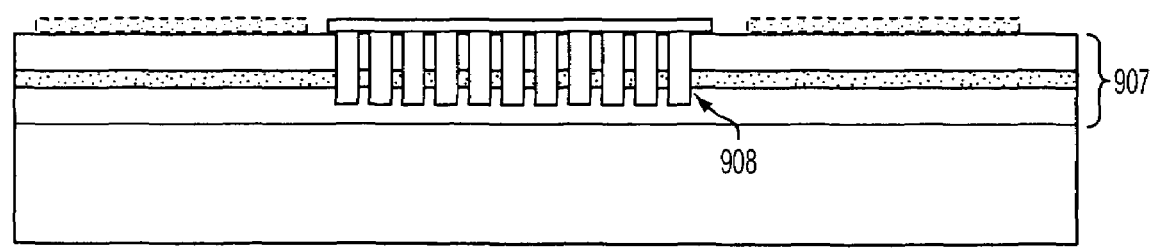

FIG. 9d shows a photonic quasicrystal 908 in an LED structure which penetrates the active layer. This is possible using low surface recombination material systems such as a GaN material system 907, because in a GaN material system surface recombination effects are less significant and hence do not affect the spontaneous emission as much as in other known LED material systems, such as GaAs. Forming the photonic quasicrystal in the active layer provides much greater confinement of optical modes (owing to increased effective refractive index contrast in the active layer) and stronger interaction with the photonic band structure. This stronger confinement allows for both the formation of smaller cavities and higher Q factors. This dramatically enhances the Purcell effect. The Purcell effect in GaN, using a regular photonic crystal is discussed in Shakya J., Kim K. H., et al., "Enhanced light extraction in III-nitride UV Photonic Crystal light-emitting diodes", APL vol. 85, no. 1, 5 Jul. 2004, Pg. 142-144.

Figure 10:
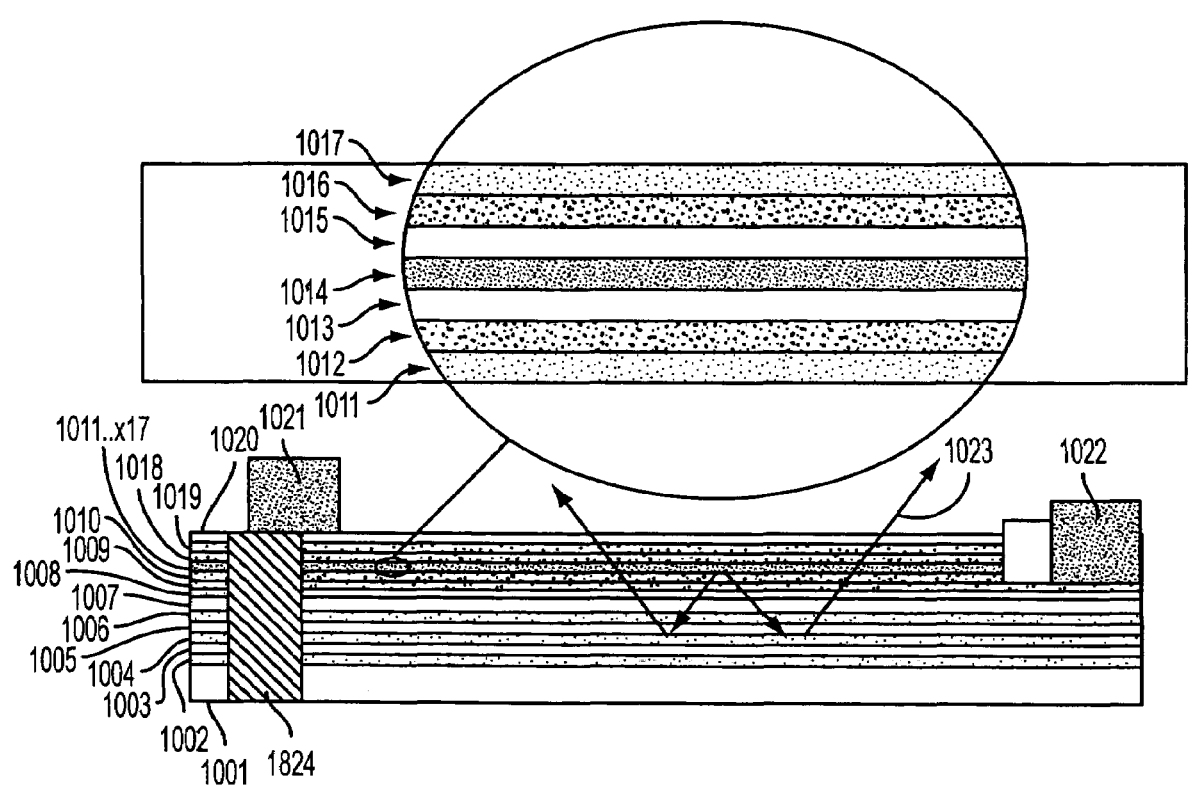
FIG. 10 shows in detail a typical LED design.

FIG. 10 shows in detail a possible design for a high efficiency microcavity LED using a GaAs material system emitting at an approximate wavelength of 960 nm. This design was proposed in (IEEE J. Select Top. In Quan. Elect. Vol. 8, no. 2, Pg 238-247, March 2002) and incorporates a high contrast DBR structure underneath the active layer 1002-1808. Each period of the DBR is composed of a layer of relatively low index $AlO_x$ (n~1.7) and a layer of high index GaAs (n~3.5). This provides a large dielectric contrast reflector giving rise to 92% of the downward emitting light being reflected back up.

Sitting on top of the DBR is the thin p-n junction. Squeezed between the p-n junction is a GRIN-SCH (Graded index separate confinement heterostructure) to confine the carriers and the light emission in a smaller active region, giving rise to a lower emission threshold.

The p electrical contact 1021 and the n electrical contact 1022 are deposited on layer 1019 and layer 1009 respectively. The layers 1002-1019 are grown using MBE (molecular beam epitaxy) or MOCVD (Metal Organic Chemical Vapour Deposition). The fabrication involves six photolithographic steps. A first photolithographic process to define the deep trenches is performed. A wet etch (using concentrated $H_3PO_4:H_2O_2$) is used to form deep trenches 1024 for the initiation of oxidation (2 hr at 450° C.) of the AlGaAs DBR layers. A second photolithographic process to define the 1022 contact location is spun. A selective wet etch to remove the top AlGaAs layers 1016-1018 and the top GaAs 1018-1019 is used. A third photolithographic process is used to evaporate the n-contact composed of Ni (10 nm)-Ge(25 nm)-Au(50 nm)-Ni(20 nm)-Au(100 nm). A fourth photolithographic process to spin an inert material into the deep trench (1824) is performed. A fifth photolithographic process is finally used to evaporate the p-contact of Au(200 nm).

Layers 1011-1017 are shown in enlarged form in FIG. 10 for clarity. Table A below described the layers referenced in FIG. 10, with their thicknesses and material.

| ITEM | COMPOUND | THICKNESS | DESCRIPTION |
|---|---|---|---|
| 1001 | GaAs | 400 mm | Substrate and buffer |
| 1002 | Oxidised $Al_{0.98}Ga_{0.02}As$ | 120 nm | Bottom of multilayer stack |
| 1003 | GaAs | 88 nm | |
| 1004 | Oxidised $Al_{0.98}Ga_{0.02}As$ | 120 nm | $2^{nd}$ period of DBR stack |
| 1005 | GaAs | 88 nm | |
| 1006 | Oxidised $Al_{0.98}Ga_{0.02}As$ | 120 nm | $3^{rd}$ period of DBR stack |
| 1007 | GaAs | 88 nm | |
| 1008 | $Al_{0.98}Ga_{0.02}As$ | 120 nm | Top of multilayer stack |
| 1009 | n-doped GaAs | 78 nm | Lower GRIN-SCH structure |
| 1010 | n-doped $Al_{0.9}Ga_{0.1}As$ | 20 nm | Lower GRIN-SCH structure |
| 1011 | $Al_{0.5}Ga_{0.5}As$ | 20 nm | Lower GRIN-SCH structure |
| 1012 | $Al_{0.1}Ga_{0.9}As$ | 15 nm | Lower GRIN-SCH structure |
| 1013 | GaAs | 10 nm | Lower GRIN-SCH structure |
| 1014 | $In_{0.04}Ga_{0.96}As$ | 7.5 nm | Quantum well emitting @ 960 nm to 970 nm |
| 1015 | GaAs | 10 nm | Upper GRIN-SCH structure |
| 1016 | $Al_{0.1}Ga_{0.9}As$ | 15 nm | Upper GRIN-SCH structure |
| 1017 | $Al_{0.5}Ga_{0.5}As$ | 20 nm | Upper GRIN-SCH structure |
| 1018 | p-doped $Al_{0.9}Ga_{0.1}As$ | 20 nm | Upper GRIN-SCH structure |
| 1019 | p-doped GaAs | 78 nm | Upper GRIN-SCH structure |
| 1020 | Air | | |
| 1021 | p electrode | | |
| 1022 | n electrode | | |

Figure 11A:
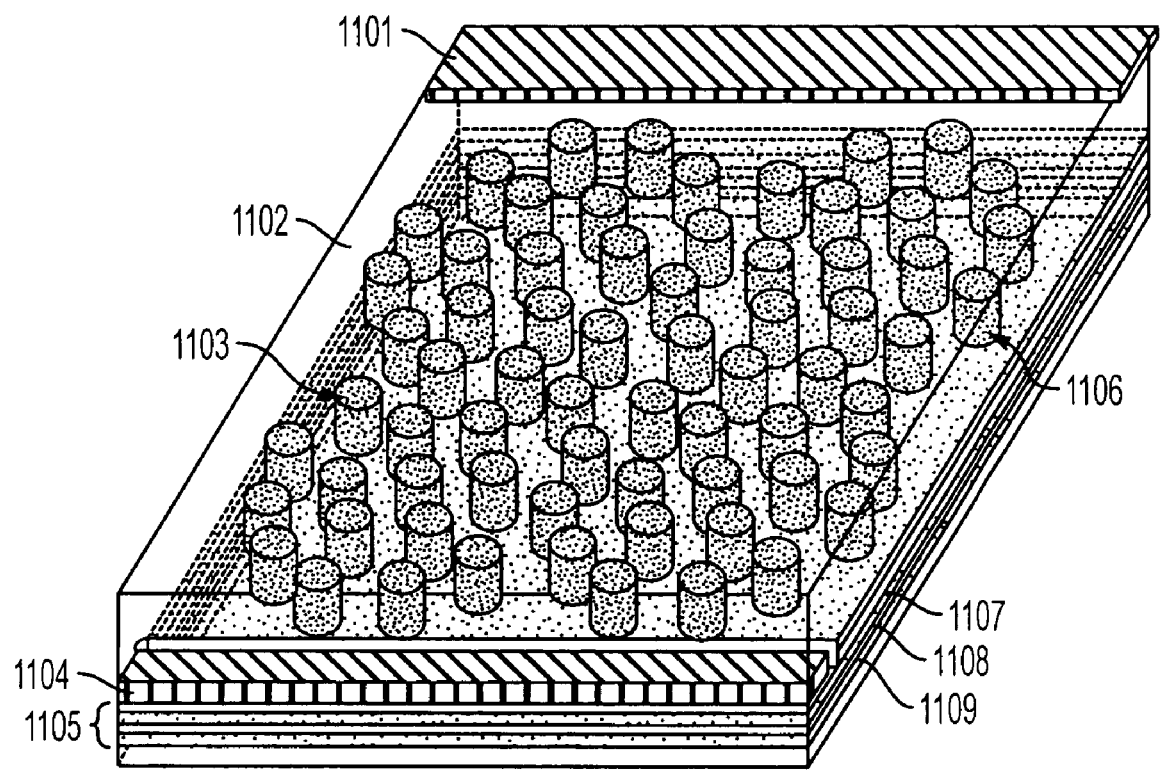
FIG. 11 shows an LED design in accordance with the present invention.
Figure 11B:
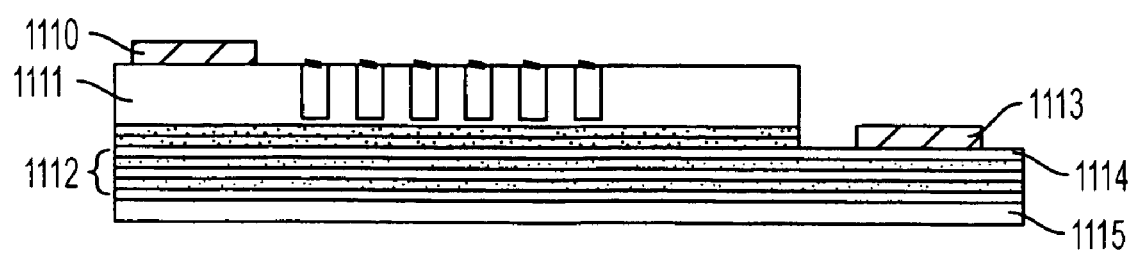

FIG. 11 shows in detail an example of a photonic quasicrystal LED design in accordance with the present invention, with a twelve-fold symmetric photonic quasicrystal arrangement of air rods 1103. The thicknesses of the various layers are not to scale for clarity. FIG. 11a is a perspective view of the LED and FIG. 11b is a cross section of the same structure.

Table B below shows the various layers referenced in FIG. 11 with their thicknesses and material type.

| ITEM | COMPOUND | THICKNESS |
|---|---|---|
| 1101 | p contact | |
| 1102 | p doped material | 200 nm |
| 1103 | Photonic quasicrystal arrangement | ~350 nm spacing between closest neighbour rods |
| 1104 | n contact | |
| 1105 | DBR mirror multilayer stack | 5 × (208 nm) |
| 1106 | Air/infilled rods | ~200 nm etch depth |
| 1107 | p doped material | 78 nm |
| 1108 | Active layer | 140 nm |
| 1109 | n doped material | 78 nm |
| 1110 | p contact | |
| 1111 | p doped material | 200 nm |
| 1112 | DBR mirror multilayer stack. | 5 × (208) nm |
| 1113 | n contact | |
| 1114 | n doped material | 78 nm |
| 1115 | substrate | 400 nm |

The LED shown in FIG. 11 can be formed in the same manner as described with reference to FIG. 10. The photonic quasicrystal is formed using an additional photolithographic etch. The etched holes may subsequently be filled with another material.

Figure 8:
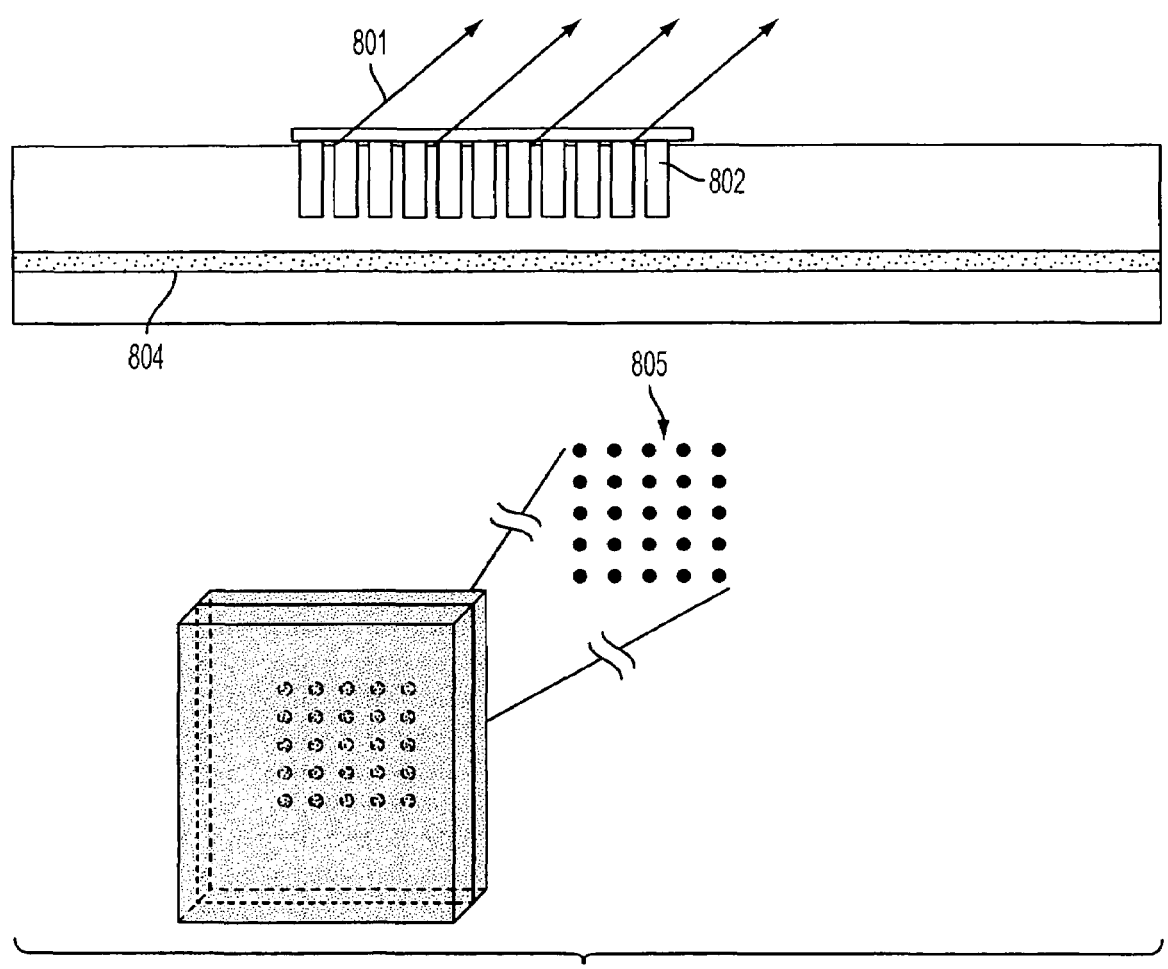
FIG. 8 illustrates a far field emission pattern for an LED with a photonic crystal in one layer.

The LED emits light over the extent of the photonic quasicrystal region. The actual quasicrystal pattern used in an LED depends on the application. As described above, ordinary 2-dimensional photonic crystals give rise to undesirable far field diffraction patterns. A regular four fold symmetric square lattice Photonic Crystal (PC) possesses a regular arrangement of bright Bragg spots in the far field, as shown in FIG. 8. If the symmetry is increased to six-fold, a triangular lattice PC projects a far field emission with a similar lattice pattern.

To rapidly predict the far field emission pattern generated by the LED due to the patterned photonic tiling imprint, a two dimensional optical transform of the photonic tiling is calculated. The arrangement of Bragg peaks formed by the transform represent the bright spots generated if the light projected from the top of the LED structure is collected in the far field on an observation plane.

In order to get a reasonably uniform far-field illumination it is preferred that the Fourier transform of the array of regions in the quasicrystal has an order of rotational symmetry greater than six.

Figure 12A:
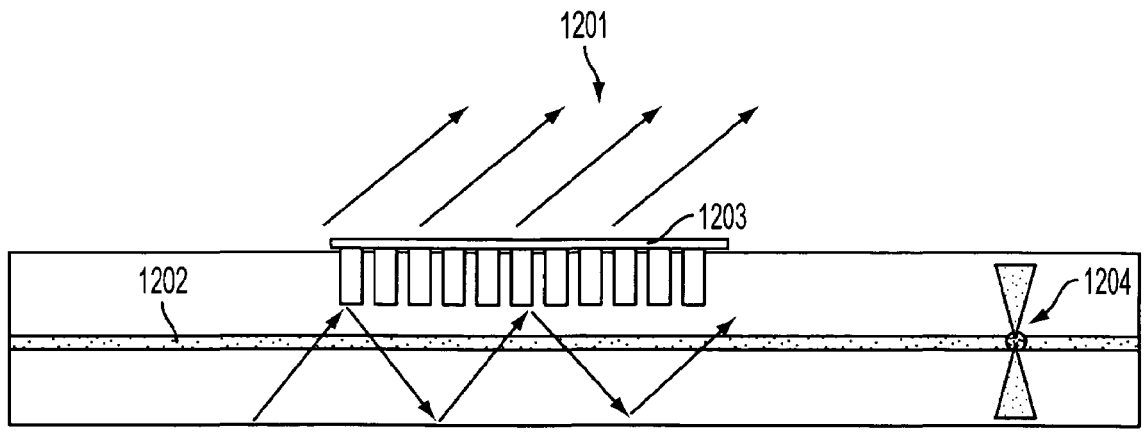
FIG. 12 illustrates a far field emission of a LED with a 12-fold symmetric quasicrystal etched into the structure.
Figure 12B:
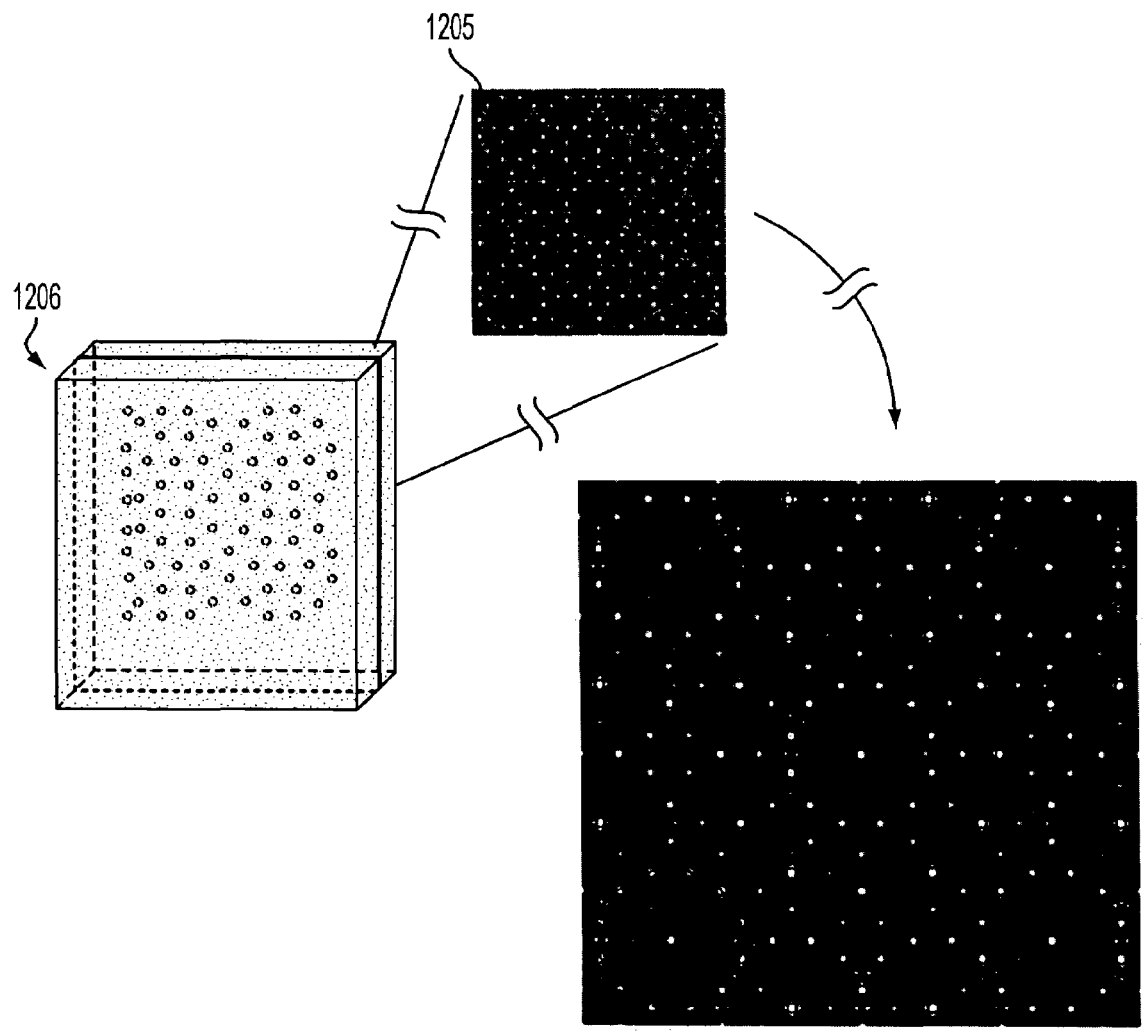

A photonic quasicrystal (PQC) can be designed to possess a highly symmetric structure, such as the 12-fold symmetric square-triangle tiling PQC shown in FIG. 12. FIG. 12a illustrates the LED structure in cross-section with the arrow 1201 signifying the light coupling out of the structure. Light is generated in the active layer 1202 and is extracted by the photonic quasicrystal 1203. The escape cone angle of the LED is shown as 1204. FIG. 12b shows a perspective view of the LED of FIG. 12a, more clearly illustrating the quasicrystal pattern. The resulting diffraction pattern in the far field is also shown. FIG. 12c is an enlarged view of the far field diffraction pattern. The 12-fold symmetric structure provides more Bragg peaks in the Fourier space than a regular photonic crystal, 12 bright peaks surrounding a central Bragg spot in the case of the example shown in FIG. 12c, and leads to a more circular diffraction pattern rather than the bright Bragg spots generated by a regular PC lattice. The generation of a greater number of far field spots in a given area provides more even illumination.

Alternatively, to provide a more circular and even illumination alternative higher order symmetry structures could also be used, such as the sunflower structure.

The sunflower structure is based on a Fibonacci spiral pattern. Preferably, in a Cartesian coordinate system, the Fibonacci spiral pattern is defined as $x_n = \cos(n\phi)\sqrt{n}$ and $y_n = \sin(n\phi)$, In where $\phi = \pi(\sqrt{5}-1)$, and where n is the integer index for a point in the pattern. To generate the pattern a point is plotted for each value of n. Those values may be n=1, 2, 3, 4 . . . etc. Alternatively, certain values of n may selectively omitted to create defects, ring patterns or zone plates. For example, odd values for n may be omitted leaving n=4, 6, 8, 10 . . . etc. In the Photonic quasicrystal, rods are placed at each of the generated points.

Figure 13:
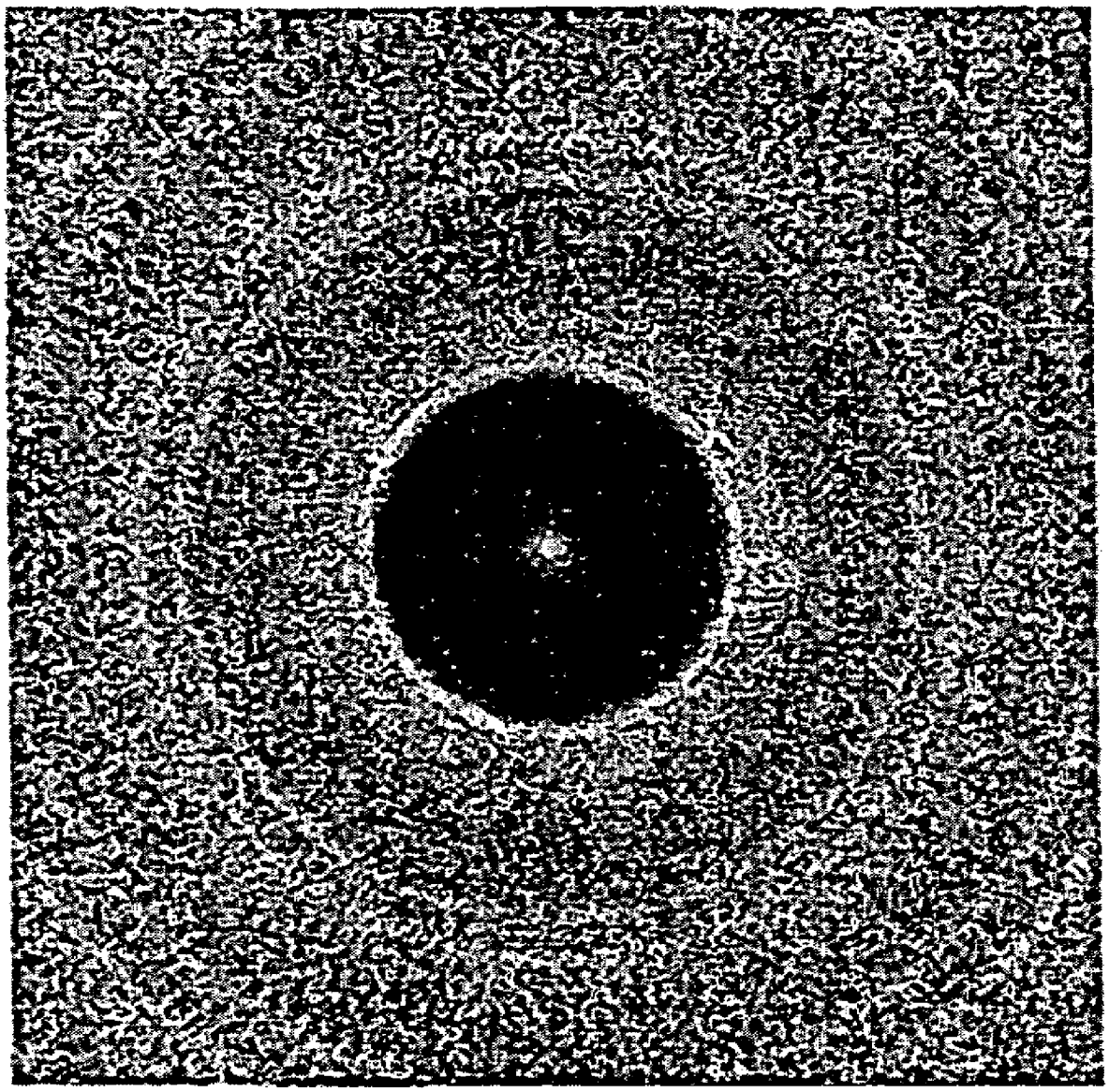
FIG. 13 shows the far field emission using a Fibonacci spiral quasicrystal structure.

FIG. 13 shows the resultant far field emission from the sunflower photonic quasicrystal structure. The sunflower provides an even ring like far field emission. Light is emitted across the extent of the photonic quasicrystal structure. The circularly symmetric band structure and band gap provides a compact microcavity where the light emission is greatly enhanced. Additionally, the sunflower pattern provides for optimal packing of rods which enhances light extraction. Each rod possesses a set amount of light extraction ability. Introducing a greater number of rods in a unit area provides increased effective filling fraction and hence increased light extraction.

Figure 14:
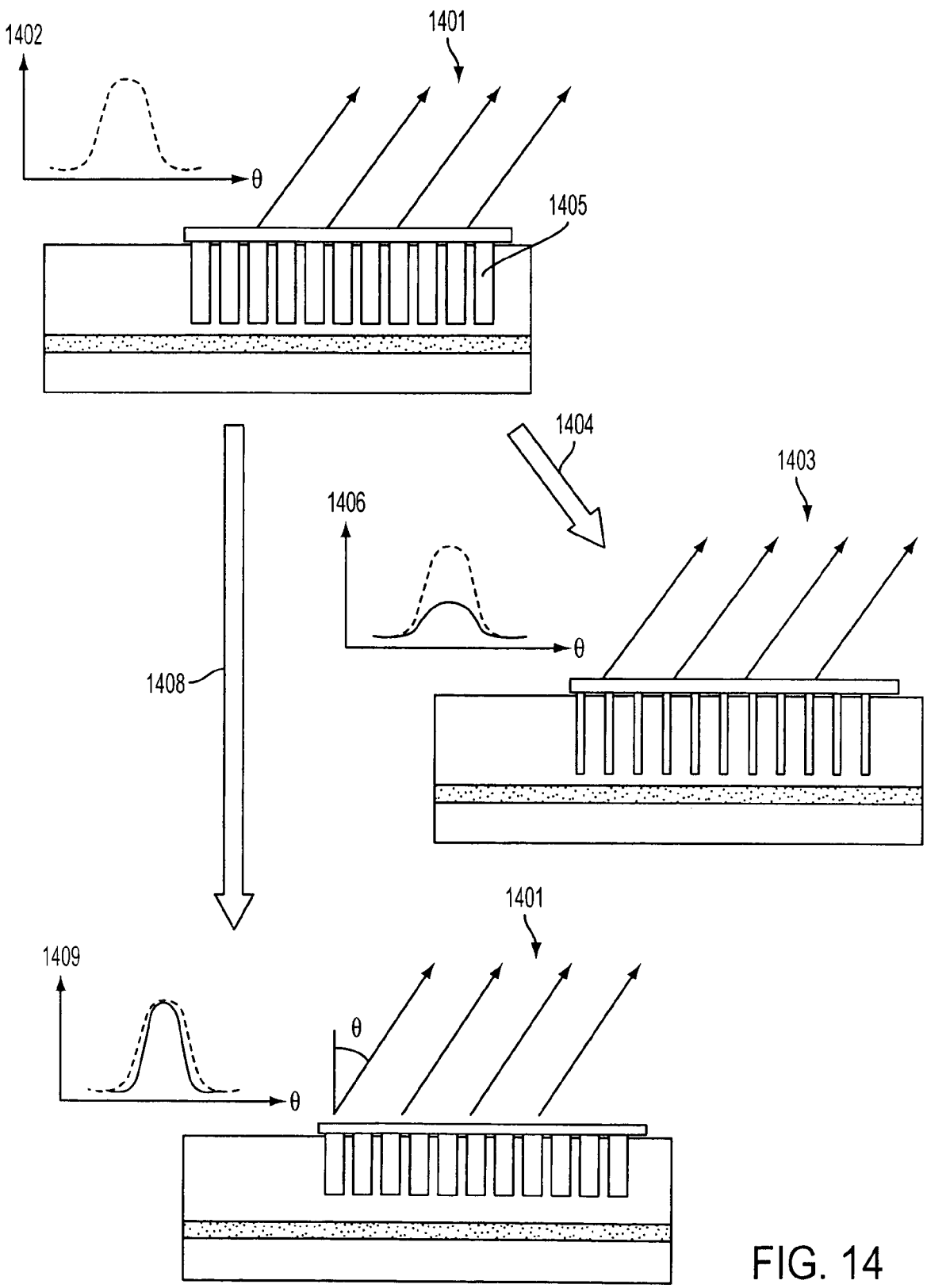
FIG. 14 illustrates variation in quasicrystal structure and the effect on out-of-plane coupling.

To provide improved extraction efficiency into specific far field emission cones different parameters can be varied. The spacing between neighbouring photonic quasicrystal rods, etch depth, rod diameter and rod shape can be altered (as shown in FIG. 14 and FIG. 15). FIG. 14 shows the effect of varying the rod diameter and rod etch depth in a photonic quasicrystal in an LED. The light emitted from an LED structure incorporating a photonic quaicrystal 1405 is indicated as 1401. The angular dependency of the emitted light is shown as an inset plot 1402 of angle versus intensity. Reduction of the rod diameter is indicated by arrow 1404. The light 1403 emitted from the altered structure is reduced, as shown by inset graph 1406. Reducing the etch depth of the rods is indicated by arrow 1408. It can be seen in inset graph 1409 that the angle over which light is emitted is reduced by reducing etch depth.

Figure 15A:
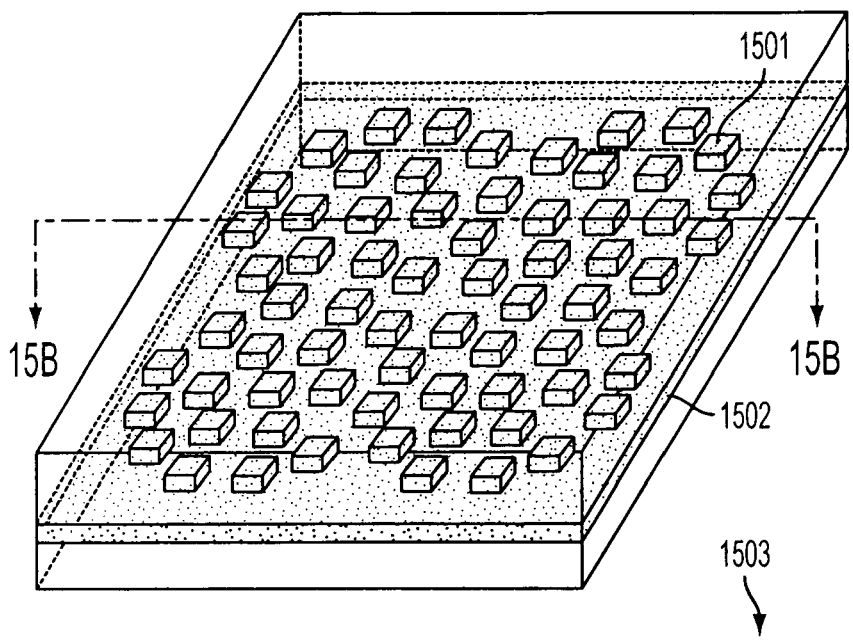
FIG. 15 illustrates possible quasicrystal geometries.
Figure 15B:
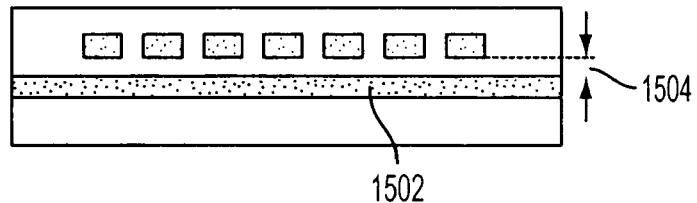
Figure 15C:
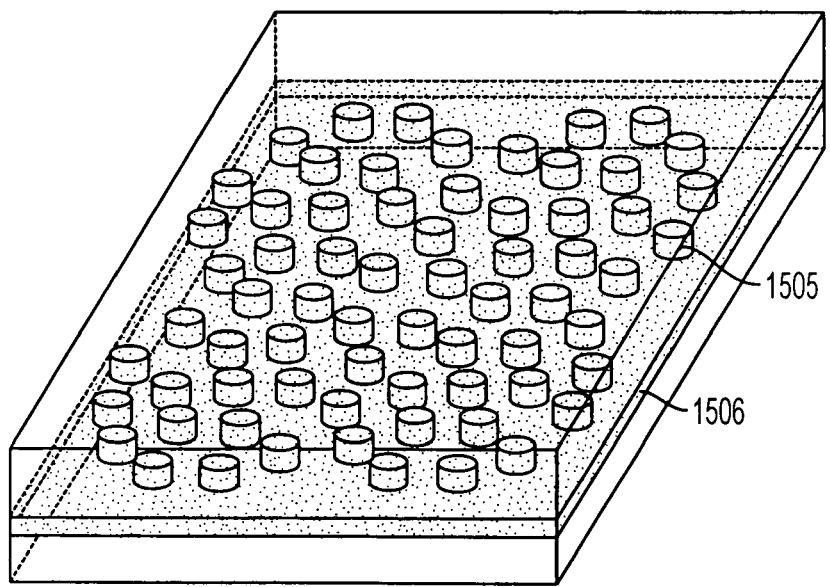

FIG. 15 shows two different possible rod shapes. FIG. 15a shows rods 1501 of square cross-section, positioned above the active layer 1502 of an LED. The rods 1501 are covered by an overlying layer. FIG. 15c shows a similar structure to FIG. 15a, with rods 1505 positioned above an active layer 1506. In this example, the rods are of circular cross-section.

Additionally, the position of the photonic quasicrystal layer relative to the active layer (denoted by 1504 on FIG. 15) can also be altered to provide tuning. The photonic quasicrystal can also equally be located below the active layer. These will alter the emission properties by extracting light at different efficiencies for different angular directions while also affecting the far field emission profile.

The position of the photonic quasicrystal layer with respect to the active layer is highlighted by 1504 as shown in FIG. 15. This variable is particularly critical in the enhancement of spontaneous emission from the active layer. The closer the photonic quasicrystal layer is to the active layer, the stronger the interaction of the emitted light with the photonic quasicrystal band structure. For the strongest interaction, a photonic quasicrystal layer is formed above and below the active region with spacing 1504 set to zero and preferably in the active layer as well if surface recombination is not critcal, such as in a GaN material system discussed with reference to FIG. 9d.

In any case, the photonic quasicrystal must be close enough to the active layer that the evanescent field of an optical mode in the active layer interacts with the photonic quasicrystal to set up a cavity mode. In a cavity mode, the mode is confined in the plane of the active layer and will eventually escape out of plane.

The photonic quasicrystal can also be formed in a thin layer of metal (such as 50 nm of Silver). This layer can be deposited on top of the active core. An interaction between the metal photonic quasicrystal (which can set up quasiperiodic surface plasmon modes) and the spontaneous emission allows the light to confine very strongly in the active layer introducing orders of magnitude increase in spontaneous emission.

A key point for the use of photonic quasicrystal tilings in LEDs for light extraction is to avoid short range order, which eliminates the bright Bragg peaks, and the exploitation of the long range order to provide smooth, ring like interferences in the far field.

Figure 16:
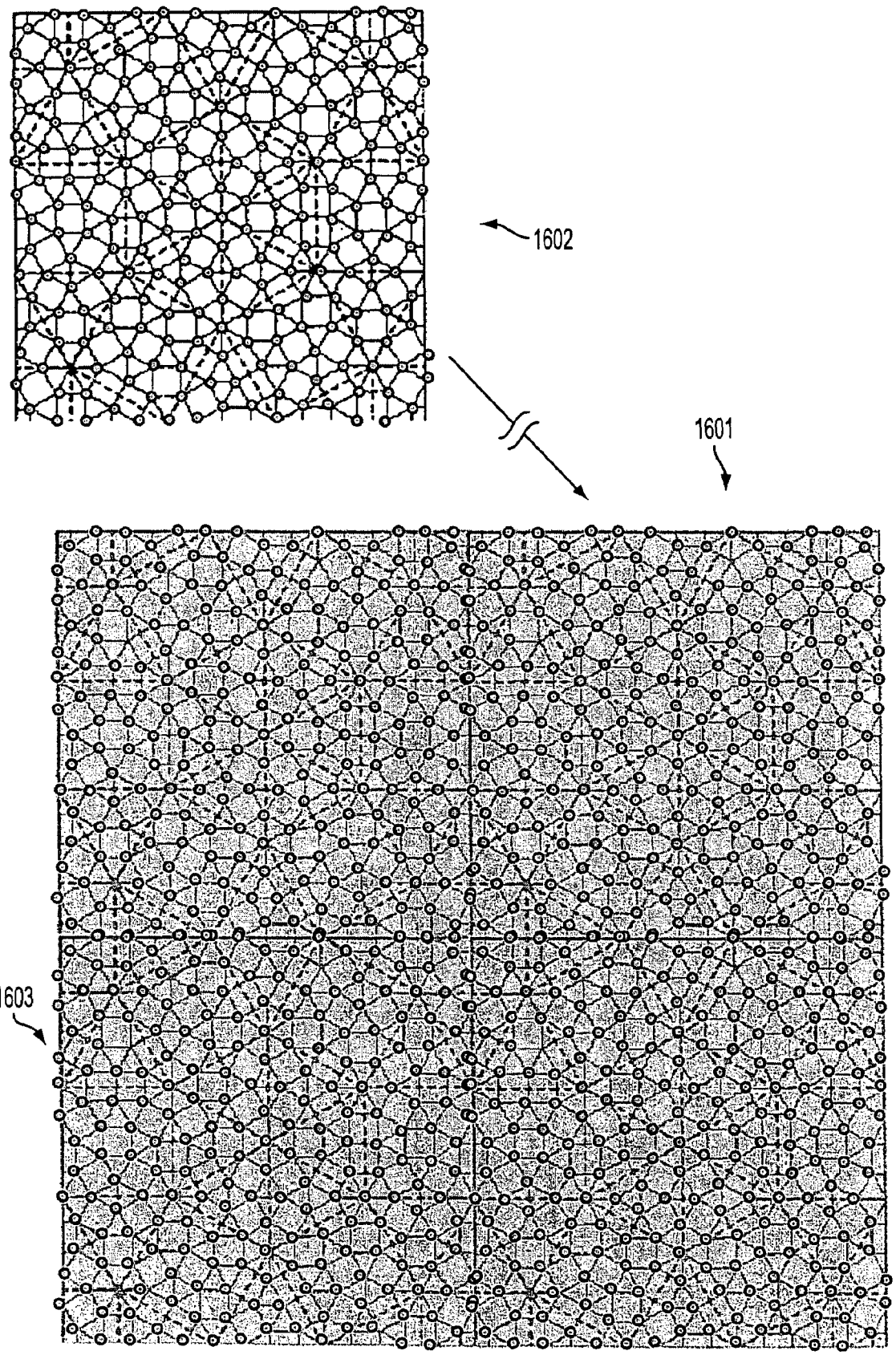
FIG. 16 illustrates the generation of repeated quasicrystal structures for use in LEDs.

In an alternative arrangement, a repeated section of a Photonic quasicrystal formed by a number of rods 1603 can be used in an LED structure. A finite number of elements from a quasicrystal tiling are selected as a supercell 1602. This supercell 1602 is then repeated in a periodic fashion to provide a large area photonic bandstructure 1601 with a highly symmetric diffractive nature, as shown in FIG. 16.

It should be noted that it is possible to generate cone like far field emission by the use of etched zone plate structures. These are composed of concentric etched rings, where the central region is designed to be active.

The structures of the present invention are preferred to zone plate type structures for both structural and optical reasons. Structurally, less material is etched (quicker and more reliable manufacturing) providing a structurally more robust design with the pattern being more connected.

Figure 17A:
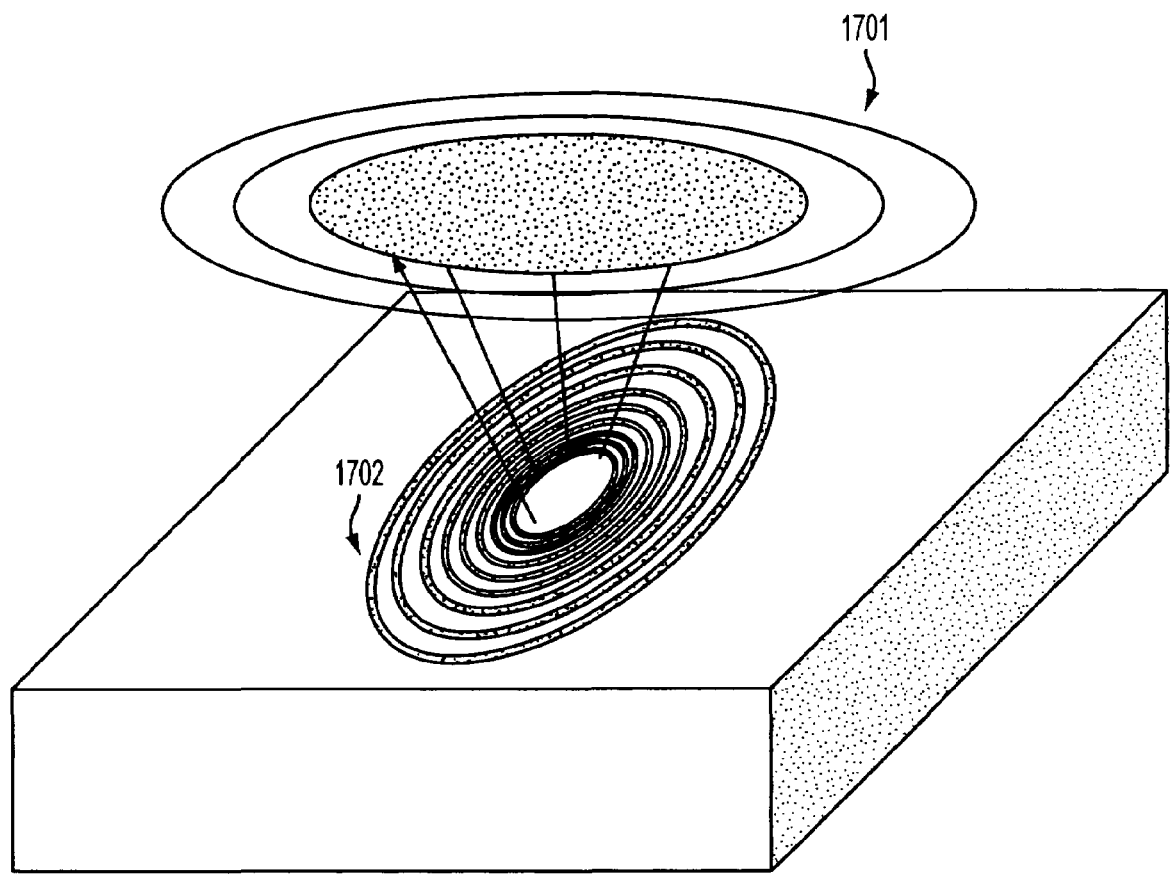
FIG. 17 illustrates a zone plate structure in an LED, over which the present invention offers advantages.
Figure 17B:
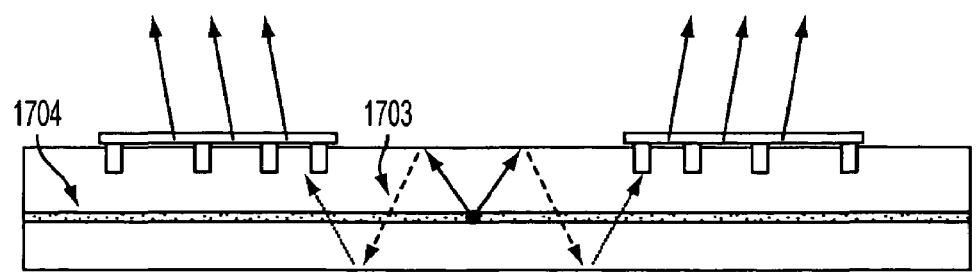

Optically, the benefits are also greater. In the case of the zone plate, the active region is confined in the centre of the structure, where a large emitting area is surrounded by the zone plates. This leads to a large central area with no extraction capability, hence in this region light is only allowed to emit in the narrow escape cone and also to totally internally reflect. The totally internally reflected light is strongly attenuated and hence only minimal light extraction enhancements are achieved. This is shown in FIG. 17. FIG. 17*a* shows a zone plate structure 1702 which, in an LED, gives rise to ring-like emission 1701. FIG. 17*b* shows the structure of FIG. 17*a* in cross-section. Light from the active layer 1704 is strongly attenuated at the centre of the zone plate as indicated by 1703.

The structure is only symmetric around the central disc, hence if light is emitted at the periphery of the disc or in between the zone plates the light is not extracted at the same cone angle hence leading to a ghosting effect in the far field emission.

Furthermore, these structures do not benefit from Purcell type enhancements, because they do not set up cavity or localised modes inside the active layer.

In the case of a Photonic quasicrystal, the highly diffractive structure is not defined by a radially symmetric structure; hence if light is emitted in any location in the structure it will interact with the band structure and couple out of the structure and generate the correct far field emission cone. This provides the capability of large areas emitting at a very well defined cone angle.

In another aspect of the present invention, amorphous photonic type structures are used in LED structures to provide a single central Bragg spot. In such a tiling the spacing between the rods is fixed and a random rotation around each rod determines the location of the next rod. These structures can potentially possess bandgaps due to the Mie scattering behaviour of the rods. However, these structures have a characteristic strong photon localisation. Optical modes can randomly scatter across the structure from one scattering centre (in this case the rods) to the other, eventually setting up very strong Anderson localisation. The modes set up by the localisation can possess very high Q factors (~10000).

Figure 18:
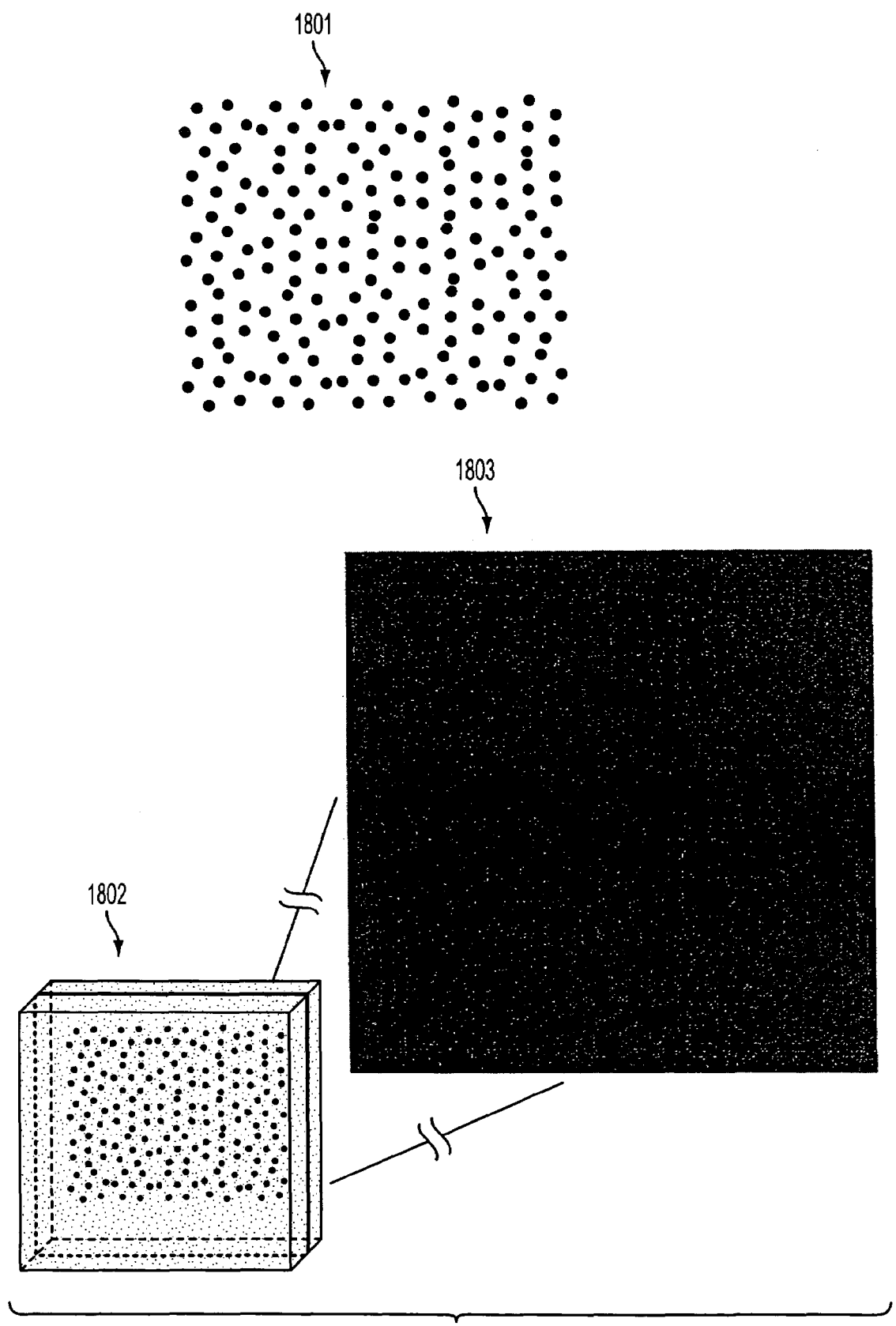
FIG. 18 illustrates an amorphous photonic band structure for use in an LED in accordance with the present invention.

Additionally, the amorphous patterning provides no form of coherent interference in the far-field and even illumination can be seen, as shown in FIG. 18. The amorphous pattern of rods is indicated by 1801. An LED structure 1802 incorporating this type of pattern gives rise to predictably uniform illumination 1803 in the far field.

LEDs have numerous application, for example, traffic lights, headlights, IR emitting objects for sensing, projection and domestic lighting. The present invention provides improved LEDs for all these applications through improved efficiency and through the form of the light output.

Figure 19:
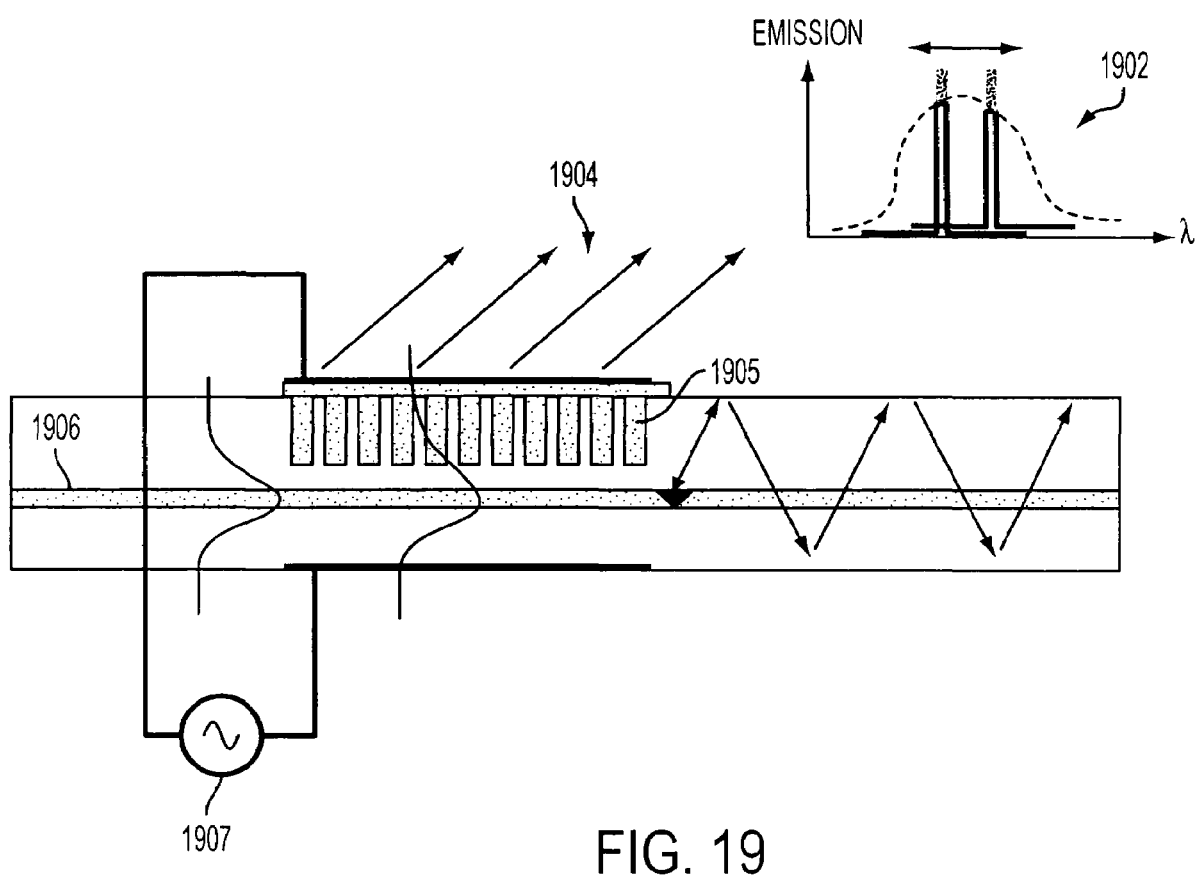
FIG. 19 illustrates a tunable quasicrystal for use in an LED in accordance with the present invention.

In a further aspect of the present invention, LED structures can have etched photonic quasicrystal rods filled with a tunable material. This could be an electrically tunable material or a liquid crystal. The material will respond by altering the refractive index of the rods, changing the band structure of the photonic quasicrystal. In this arrangement the level of confinement of the light as well as the absolute wavelength can be tuned. This in turn can alter the emission properties by either preferentially emitting at a slightly different wavelength or different intensity from the LED which may possess a broad wavelength emission range. In an application where the LED is used to generate light for a projector, this can offer a means of providing different mood settings (warm colors for movies, or maximum brightness for presentations). An example of this set up is shown in FIG. 19. An LED structure having an active layer 1906 emits light 1904 from its top surface at a region having a photonic quasicrystal structure 1905 as previously described. The rods of the photonic quasicrystal are filled with a material with a refractive index that can be tuned by the application of an electric field. The electric field is applied across the structure from a voltage source 1907. The emission 1904 from the structure is shown in plot 1902, which is a plot of emission versus wavelength. The dotted line indicates the emission characteristic of the active layer 1906. A small portion of the band of wavelengths is emitted from the top of the structure as a result of the photonic band structure of the photonic quasicrystal. By tuning the refractive index of the rods 1905 the emitted band of wavelengths can be selected.

The invention claimed is:

1. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the first layer comprising a first region having a first refractive index and further comprising a 2-dimensional photonic quasicrystal, wherein the first region comprises a p-doped semiconductor material and the photonic quasicrystal comprises an array of sub-regions exhibiting long range order but short range disorder, each sub-region having a second refractive index different to the first refractive index.

2. A light emitting diode (LED) structure according to claim 1, wherein the sub-regions do not extend to the upper surface of the first layer.

3. A light emitting diode (LED) structure according to claim 1, wherein the photonic quasicrystal extends into the light-generating layer.

4. A light emitting diode (LED) structure according to claim 1, wherein the second layer comprises a first region having a first refractive index and further comprises a 2-dimensional photonic quasicrystal, wherein the photonic quasicrystal comprises an array of sub-regions exhibiting long range order but short range disorder, each sub-region having a second refractive index different to the first refractive index.

5. A light emitting diode (LED) structure according to claim 1, wherein the Fourier transform of the array has a degree of rotational symmetry n, where n>6.

6. A light emitting diode (LED) structure according to claim 1, wherein the photonic quasicrystal is designed to have a bandgap that overlaps with the emission spectrum of the active layer in the LED.

7. A light emitting diode (LED) structure according to claim 6, wherein the bandgap extends in all directions and for all polarisations.

8. A light emitting diode (LED) structure according to claim 1, wherein the array is in the form of a Fibonacci spiral pattern.

9. A light emitting diode (LED) structure according to claim 1, wherein the array is in a Penrose tiling pattern.

10. A light emitting diode (LED) structure according to claim 1, wherein a section of the photonic quasicrystal is repeated periodically.

11. A light emitting diode (LED) structure according to claim 1, wherein the sub regions comprise a tunable material.

12. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the second layer comprising a first region having a first refractive index and further comprising a 2-dimensional photonic quasicrystal, wherein the photonic quasicrystal comprises an array of sub-regions exhibiting long range order but short range disorder, each sub-region having a second refractive index different to the first refractive index.

13. A light emitting diode (LED) structure according to claim 12, wherein the second layer has an upper surface proximate the light-generating layer and a lower surface distal the light-generating layer and wherein the sub regions in the second layer do not extend to the lower surface of the second layer.

14. A light emitting diode (LED) structure according to claim 12, wherein the second layer has an upper surface proximate the light-generating layer and a lower surface distal the light-generating layer and wherein the sub regions in the second layer do not extend to the upper surface of the second layer.

15. A light emitting diode (LED) structure according to claim 12, wherein the second layer has an upper surface proximate the light-generating layer and a lower surface distal the light-generating layer and wherein the sub regions in the second layer do not extend to the upper surface or the lower surface of the second layer.

16. A light emitting diode (LED) structure according to claim 12, wherein the first layer comprises a first region having a first refractive index and further comprises a 2-dimensional photonic quasicrystal, wherein the photonic quasicrystal of the first layer comprises an array of sub-regions exhibiting long range order but short range disorder, each sub-region having a second refractive index different to the first refractive index.

17. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the first layer comprising a first region having a first refractive index and further comprising a periodically-repeated section of a 2-dimensional photonic quasicrystal, wherein the photonic quasicrystal comprises an array of sub-regions exhibiting long range order but short range disorder, each sub-region having a second refractive index different to the first refractive index.

18. A light emitting diode (LED) structure comprising a first layer and a light-generating layer, the first layer comprising a first region having a first refractive index and further comprising a 2-dimensional photonic quasicrystal, wherein light generated in the light-generating layer by spontaneous emission is extracted by the photonic quasicrystal and coupled out of the LED structure, wherein the photonic quasicrystal comprises an array of sub-regions exhibiting long range order but short range disorder, each sub-region having a second refractive index different to the first refractive index, wherein the photonic quasicrystal is configured to have a bandgap that does not overlap with an emission spectrum of the light-generating layer.

19. A light emitting diode (LED) structure comprising a first layer and a light-generating layer, the first layer comprising a first region having a first refractive index and further comprising a 2-dimensional photonic quasicrystal, wherein light generated in the light-generating layer by spontaneous emission is extracted by the photonic quasicrystal and coupled out of the LED structure, wherein the photonic quasicrystal comprises an array of sub-regions exhibiting long range order but short range disorder, each sub-region having a second refractive index different to the first refractive index, wherein the photonic quasicrystal is configured to have a bandgap that overlaps with an emission spectrum of the light-generating layer.

20. A light emitting diode (LED) structure comprising a first layer, a second layer, and a light-generating layer, the first layer having an upper surface distal the light-generating layer and a lower surface proximate the light-generating layer, wherein light generated in the light-generating layer by spontaneous emission emerges from the LED structure through the upper surface of the first layer, the second layer disposed in a part of the LED structure closer to the lower surface of the first layer than the upper surface of the first layer, the second layer comprising a first region having a first refractive index and further comprising a 2-dimensional photonic quasicrystal, wherein the photonic quasicrystal comprises an array of sub-regions exhibiting long range order but short range disorder, each sub-region having a second refractive index different to the first refractive index, wherein the first region of the second layer comprises a metallic material.

21. A light emitting diode (LED) structure according to claim 20, wherein the metallic material comprises silver.

22. A light emitting diode (LED) structure comprising a first layer and a light-generating layer, the first layer comprising a first region having a first refractive index and further comprising a 2-dimensional photonic quasicrystal, wherein light generated in the light-generating layer by spontaneous emission is extracted by the photonic quasicrystal and coupled out of the LED structure, wherein the photonic quasicrystal comprises an array of sub-regions exhibiting long range order but short range disorder, each sub-region having a second refractive index different to the first refractive index, wherein each sub-region comprises a material other than air.

23. A light emitting diode (LED) structure according to claim 22, wherein the refractive index of the material forming each sub-region is tunable.

24. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the first layer comprising a first region having a first refractive index and further comprising a 2-dimensional photonic quasicrystal, wherein the photonic quasicrystal comprises an array of sub-regions exhibiting long range order but short range disorder, each sub-region having a refractive index different to the first refractive index, and wherein at least one parameter of the sub-regions varies across the array, the parameter selected from a group which includes a geometrical property and a material property of the sub-regions.

25. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the first layer comprising a first region having a first refractive index and further comprising a 2-dimensional photonic quasicrystal, wherein the photonic quasicrystal comprises an array of sub-regions exhibiting long range order but short range disorder, wherein the shape sub-regions have a substantially square cross-section in a plane parallel to the upper surface of the first layer.

26. A light emitting diode (LED) structure comprising a first layer, a second layer, and a light-generating layer disposed between the first and second layers, the first layer having an upper surface distal the light-generating layer and a lower surface proximate the light-generating layer, wherein light generated in the light-generating layer by spontaneous emission emerges from the LED structure through the upper surface of the first layer, the first layer comprising a first region having a first refractive index and further comprising a 2-dimensional photonic quasicrystal, wherein the photonic quasicrystal comprises an array of sub-regions arranged in a pattern which exhibits long range order but short range disorder, each sub-region having a second refractive index different to the first refractive index, the pattern comprising either a Fibonacci spiral pattern or a Penrose tiling pattern or a square-triangle tiling pattern.

27. A light emitting diode (LED) structure according to claim 26, wherein the pattern includes defects.

* * * * *